(12) United States Patent
Kumar et al.

(10) Patent No.: US 7,691,694 B2
(45) Date of Patent: Apr. 6, 2010

(54) SILICON CARBIDE SEMICONDUCTOR DEVICE HAVING JUNCTION FIELD EFFECT TRANSISTOR AND METHOD FOR MANUFACTURING THE SAME

(75) Inventors: Rajesh Kumar, Nagoya (JP); Andrei Mihaila, Cambridge (GB); Florin Udrea, Cambridge (GB)

(73) Assignee: DENSO CORPORATION, Kariya (JP)

( * ) Notice: Subject to any disclaimer, the term of this patent is extended or adjusted under 35 U.S.C. 154(b) by 373 days.

(21) Appl. No.: 11/785,276

(22) Filed: Apr. 17, 2007

(65) Prior Publication Data

US 2007/0200117 A1 Aug. 30, 2007

Related U.S. Application Data

(62) Division of application No. 10/984,957, filed on Nov. 10, 2004, now Pat. No. 7,230,275.

(30) Foreign Application Priority Data

Nov. 14, 2003 (JP) ............................ 2003-385094

(51) Int. Cl.
*H01L 21/337* (2006.01)
(52) U.S. Cl. .................. 438/195; 438/186; 438/931; 257/77; 257/261; 257/270; 257/279
(58) Field of Classification Search ................. 438/186, 438/195, 931; 257/77, 261, 270, 279
See application file for complete search history.

(56) References Cited

U.S. PATENT DOCUMENTS 6,303,947 B1 10/2001 Ueno 6,573,534 B1 6/2003 Kumar et al.
6,576,929 B2 6/2003 Kumar et al.

(Continued)

FOREIGN PATENT DOCUMENTS

JP A-S59-041871 3/1984

(Continued)

OTHER PUBLICATIONS

Office Action issued from British Patent Office mailed on Aug. 8, 2005 for the corresponding British patent application No. GB0425080.9.

(Continued)

*Primary Examiner*—Zandra Smith
*Assistant Examiner*—Christy L Novacek
(74) *Attorney, Agent, or Firm*—Posz Law Group, PLC

(57) ABSTRACT

A silicon carbide semiconductor device includes a substrate and a junction field effect transistor. The transistor includes: a first semiconductor layer disposed on the substrate; a first gate layer disposed on a surface of the first semiconductor layer; a first channel layer adjacent to the first gate layer on the substrate; a first source layer connecting to the first channel layer electrically; a second gate layer adjacent to the first channel layer to sandwich the first channel layer; a second channel layer adjacent to the second gate layer to sandwich the second gate layer; a third gate layer adjacent to the second channel layer to sandwich the second channel layer; and a second source layer connecting to the second channel layer electrically.

16 Claims, 14 Drawing Sheets

U.S. PATENT DOCUMENTS

| | | | |
|---|---|---|---|
| 6,855,970 B2 * | 2/2005 | Hatakeyama et al. | ....... 257/264 |
| 2003/0042491 A1 | 3/2003 | Kumar et al. | |
| 2005/0139859 A1 | 6/2005 | Kumar et al. | |

FOREIGN PATENT DOCUMENTS

| | | |
|---|---|---|
| JP | A-2000-312008 | 11/2000 |
| JP | A-2003-318409 | 11/2003 |

OTHER PUBLICATIONS

F. Udrea et al., "A double channel normally-off SiC JFET device with ultra-low on-state resistance," *Proceedings of 2004 International Symposium on Power Semiconductor Devices & ICs*, 2004, pp. 309-312.

J.H. Zhao et al., "Demonstration of first 1050V 21.7 m$\Omega$cm$^2$ normally-off 4H-SiC junction field-effect transistor with implanted vertical channel," *Electronic Letters*, vol. 39, No. 1 Jan. 9, 2003, pp. 151-152.

First Office Communication (and English translation) from Chinese Patent Office containing a Preliminary Rejection dated Apr. 6, 2007 in the corresponding Chinese Application 2004100926459.

Office Action mailed Nov. 4, 2009 in corresponding Japanese patent application No. 2003-385094 (and English translation).

* cited by examiner

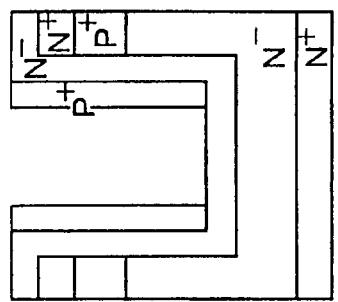
FIG. 13A
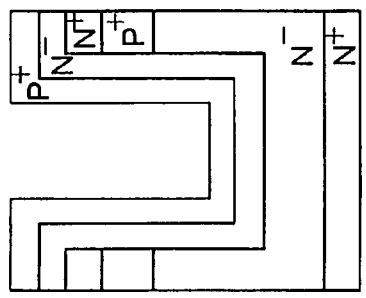
FIG. 13B
FIG. 13C
FIG. 13D
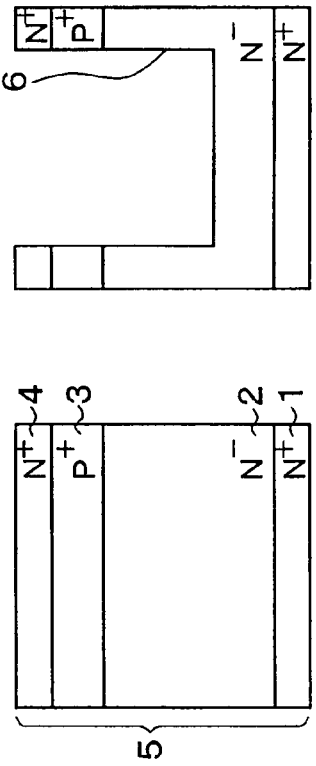
FIG. 13E
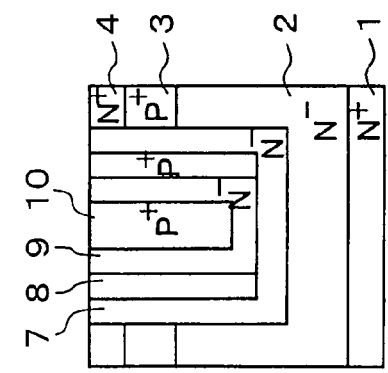
FIG. 13F
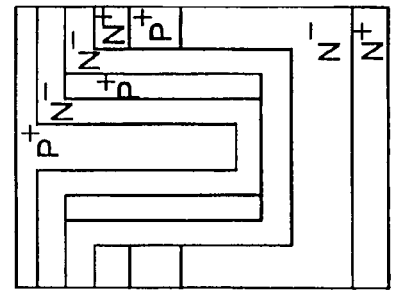

US 7,691,694 B2

SILICON CARBIDE SEMICONDUCTOR DEVICE HAVING JUNCTION FIELD EFFECT TRANSISTOR AND METHOD FOR MANUFACTURING THE SAME

CROSS REFERENCE TO RELATED APPLICATION

This application is a division of application Ser. No. 10/984,957 filed on Nov. 10, 2004, which is based on Japanese Patent Application No. 2003-385094 filed on Nov. 14, 2003, the disclosure of which is incorporated herein by reference.

FIELD OF THE INVENTION

The present invention relates to a silicon carbide semiconductor device having a junction field effect transistor and a method for manufacturing the same.

BACKGROUND OF THE INVENTION

A semiconductor device having a junction field effect transistor (i.e., a J-FET) in a prior art is disclosed in, for example, Japanese Patent Application Publication No. 2000-312008. The device is shown in FIG. 17. As shown in FIG. 17, the device includes a substrate J4 composed of an $N^+$ conductive type substrate J1, an $N^-$ conductive type drift layer J2 and a $P^+$ conductive type first gate layer J3, which are laminated in this order. A trench J5 is formed in the substrate J4 to penetrate the $P^+$ conductive type first gate layer J3. An $N^-$ conductive type channel layer J6 and a $P^+$ conductive type second gate layer J7 are formed in the trench J5. An $N^+$ conductive type source layer J8 is formed in such a manner that an ion implantation is performed on the surface of the $N^-$ conductive type channel layer J6. In this construction, the $P^+$ conductive type first gate layer J3 and the $P^+$ conductive type second gate layer J7 sandwich the $N^-$ conductive type channel layer J6 so that an applied voltage applied to the $P^+$ conductive type first gate layer J3 and to the $P^+$ conductive type second gate layer J7 is controlled. Thus, extension of a depletion layer extending from the $P^+$ conductive type first gate layer J3 and form the $P^+$ conductive type second gate layer J7 is controlled so that a current between a source and a drain can be controlled.

In the semiconductor device having the above constitution, the extension of the depletion layer extending from the $P^+$ conductive type first gate layer J3 and from the $P^+$ conductive type second gate layer J7 is defined by an impurity concentration in the $P^+$ conductive type first gate layer J3 and the $P^+$ conductive type second gate layer J7 and by the impurity concentration in the $N^-$ conductive type channel layer J6. Therefore, the impurity concentration in each layer J3, J6, J7 and the thickness of the $N^-$ conductive type channel layer J6 are optimized so that the semiconductor device can provide a normally off type device.

When the normally off type semiconductor device made of silicon carbide is designed, the following points become mainly problems for obtaining a low on-state resistance.

(1) The $P^+$ conductive type first and second gate layers J3, J7 works as a control gate so that the applied voltage applied to the $P^+$ conductive type first and second gate layers J3, J7 is limited by a built-in potential in a silicon carbide matrix. For example, in case of 4H-SiC, the built-in potential is about 2.9V. Therefore, when the semiconductor device is operated under a high temperature about 250° C., the maximum value of the applied voltage applied to the $P^+$ conductive type first and second gate layers J3, J7 is limited about 2.5V.

(2) In the normally off type semiconductor device, it is required to deplete the $N^-$ conductive type channel layer J6 completely by the depletion layer extending from the $P^+$ conductive type first and second gate layers J3, J7. Thus, the $N^-$ conductive type channel layer J6 is required to become a low impurity concentration. Therefore, the $N^-$ conductive type channel layer J6 becomes a high resistance. Accordingly, the semiconductor device becomes a high on-state resistance so that the maximum current flowing through the device is limited.

In view of the above points, it is impossible to avoid the problem of No. (1) since the semiconductor device is made of silicon carbide. Therefore, it is required to solve the problem of No. (2) so that the on-state resistance of the silicon carbide semiconductor device is reduced as low as possible.

SUMMARY OF THE INVENTION

In view of the above-described problem, it is an object of the present invention to provide a silicon carbide semiconductor device having a junction field effect transistor and a method for manufacturing the same.

A silicon carbide semiconductor device includes: a substrate made of silicon carbide and having a first conductive type; and a junction field effect transistor disposed on the substrate. The junction field effect transistor includes: a first semiconductor layer disposed on the substrate, having the first conductive type, and made of silicon carbide with a low impurity concentration lower than the substrate; a first gate layer having a second conductive type, disposed on a surface of the first semiconductor layer, and made of silicon carbide; a first channel layer having the first conductive type and disposed adjacent to the first gate layer in a planar direction on the substrate; a first source layer having the first conductive type, having a high impurity concentration higher than the first channel layer, and connecting to the first channel layer electrically; a second gate layer having the second conductive type, disposed adjacent to the first channel layer, and being opposite to the first gate layer to sandwich the first channel layer; a second channel layer having the first conductive type, disposed adjacent to the second gate layer, and being opposite to the first channel layer to sandwich the second gate layer; a third gate layer disposed adjacent to the second channel layer and being opposite to the second gate layer to sandwich the second channel layer; and a second source layer having the first conductive type, having a high impurity concentration higher than the second source layer, and connecting to the second channel layer electrically.

In the above constitution, a plurality of channel layers is disposed in each cell of the J-FET. Therefore, when the J-FET is operated, a plurality of channel regions is prepared so that the on-state resistance of the device is reduced even when the maximum voltage applied to a gate of the device is limited.

Preferably, the first channel layer has an impurity concentration higher than the first semiconductor layer. When the first channel layer has an impurity concentration higher than the first semiconductor layer, the inner resistance of the first channel layer is much reduced so that the on-state resistance of the device can be much reduced.

Preferably, the second channel layer has an impurity concentration higher than the first channel layer. When the second channel layer has an impurity concentration higher than the first channel layer, the inner resistance of the second channel layer is much reduced so that the on-state resistance of the device can be much reduced.

Preferably, the second gate layer has a depth deeper than the third gate layer. In the above constitution, an electric field is prevented from penetrating to an upper side of the semiconductor substrate by a shield effect at the second gate layer when a reverse bias is applied to the device. Therefore, the withstand voltage of the silicon carbide semiconductor device is improved.

Preferably, the second gate layer has an impurity concentration lower than the third gate layer. In the above constitution, the electric field penetrates in the second gate layer effectively so that equipotential lines are almost flat to be parallel to a horizontal direction of the semiconductor substrate. Thus, a RESURF effect can be obtained effectively so that the silicon carbide semiconductor device having a high withstand voltage is obtained.

Further, a silicon carbide semiconductor device includes a semiconductor substrate, which includes: a substrate made of silicon carbide and having a first conductive type; a first semiconductor layer disposed on the substrate, having the first conductive type, and made of silicon carbide with a low impurity concentration lower than the substrate; a second semiconductor layer disposed on the first semiconductor layer, having a second conductive type, made of silicon carbide, and providing a first gate layer; and a third semiconductor layer having the first conductive type, made of silicon carbide, and providing a first source layer. The device further includes: a trench disposed on a surface of the semiconductor substrate, penetrating the second and third semiconductor layers, and reached the first semiconductor layer; a first channel layer having the first conductive type and disposed on an inner wall of the trench; a second gate layer having the second conductive type, disposed on a sidewall of the trench through the first channel layer; a second channel layer having the first conductive type, disposed on the sidewall of the trench through the first channel layer and the second gate layer, and disposed on a bottom of the trench through the first channel layer; a third gate layer having the second conductive type and disposed on the inner wall of the trench through the second channel layer; and a second source layer having the first conductive type, having a high impurity concentration higher than the second channel layer, and disposed on a part of the surface of the semiconductor substrate corresponding to the second channel layer so that the second source layer connects to the second channel layer electrically.

In the above constitution, a plurality of channel layers is disposed in each cell of the J-FET. Therefore, when the J-FET is operated, a plurality of channel regions is prepared so that the on-state resistance of the device is reduced even when the maximum voltage applied to a gate of the device is limited.

Further, a silicon carbide semiconductor device includes a semiconductor substrate, which includes: a substrate made of silicon carbide and having a first conductive type; a first semiconductor layer disposed on the substrate, having the first conductive type, and made of silicon carbide with a low impurity concentration lower than the substrate; and a second semiconductor layer disposed on the first semiconductor layer, having a second conductive type, made of silicon carbide, and providing a first gate layer. The device further includes: a trench disposed on a surface of the semiconductor substrate, penetrating the second semiconductor layer, and reached the first semiconductor layer; a first channel layer having the first conductive type, disposed on an inner wall of the trench, and disposed on the second semiconductor layer; a second gate layer having the second conductive type, disposed on a sidewall of the trench through the first channel layer; a second channel layer having the first conductive type, disposed on the sidewall of the trench through the first channel layer and the second gate layer, and disposed on a bottom of the trench through the first channel layer; a third gate layer having the second conductive type and disposed on an inner wall of the trench through the second channel layer; and a source layer having the first conductive type, having a high impurity concentration higher than the second channel layer, disposed on disposed on a part of the surface of the semiconductor substrate corresponding to the second channel layer so that the source layer connects to the second channel layer electrically, and disposed on another part of the surface of the semiconductor substrate corresponding to the first channel layer so that the source layer connects to the first channel layer electrically.

In the above constitution, a plurality of channel layers is disposed in each cell of the J-FET. Therefore, when the J-FET is operated, a plurality of channel regions is prepared so that the on-state resistance of the device is reduced even when the maximum voltage applied to a gate of the device is limited.

Furthermore, a method for manufacturing a silicon carbide semiconductor device includes the steps of: preparing a substrate having a first conductive type and made of silicon carbide; forming a first semiconductor layer on the substrate, wherein the first semiconductor layer has the first conductive type and is made of silicon carbide with a low impurity concentration lower than the substrate; forming a first gate layer on a surface of the first semiconductor layer, wherein the first gate layer has a second conductive type and is made of silicon carbide; forming a first channel layer on the substrate to be adjacent to the first gate layer in a planar direction, wherein the first channel layer has the first conductive type; forming a first source layer to connect to the first channel layer electrically, wherein the first source layer has the first conductive type and has a high impurity concentration higher than the first channel layer; forming a second gate layer to be adjacent to the first channel layer, wherein the second gate layer has the second conductive type and is disposed opposite to the first gate layer to sandwich the first channel layer; forming a second channel layer to be adjacent to the second gate layer, wherein the second channel layer has the first conductive type and is disposed opposite to the first channel layer to sandwich the second gate layer; forming a third gate layer to be adjacent to the second channel layer, wherein the third gate layer is disposed opposite to the second gate layer to sandwich the second channel layer; and forming a second source layer to connect to the second channel layer electrically, wherein the second source layer has the first conductive type and has a high impurity concentration higher than the second channel layer.

The above method provides the silicon carbide semiconductor device, which includes a plurality of channel layers disposed in each cell of the J-FET. Therefore, when the J-FET is operated, a plurality of channel regions is prepared so that the on-state resistance of the device is reduced even when the maximum voltage applied to a gate of the device is limited.

Further, a method for manufacturing a silicon carbide semiconductor device includes the steps of: preparing a semiconductor substrate, which includes: a substrate made of silicon carbide and having a first conductive type; a first semiconductor layer disposed on the substrate, having the first conductive type, and made of silicon carbide with a low impurity concentration lower than the substrate; a second semiconductor layer having a second conductive type, made of silicon carbide, and providing a first gate layer; and a third semiconductor layer having/the first conductive type, made of silicon carbide, and providing a first source layer; forming a trench on a surface of the semiconductor substrate to penetrate the second and third semiconductor layers and to reach the first semiconductor layer; forming a first channel layer having the first conductive type on an inner wall of the trench;

forming a second gate layer having the second conductive type on a sidewall of the trench through the first channel layer; forming a second channel layer having the first conductive type on the sidewall of the trench through the first channel layer and the second gate layer and on a bottom of the trench through the first channel layer; forming a third gate layer having the second conductive type on the inner wall of the trench through the second channel layer; and forming a second source layer on a part of the surface of the semiconductor substrate corresponding to the second channel layer so that the second source layer connects to the second channel layer electrically, wherein the second source layer has the first conductive type and has a high impurity concentration higher than the second channel layer.

The above method provides the silicon carbide semiconductor device, which includes a plurality of channel layers disposed in each cell of the J-FET. Therefore, when the J-FET is operated, a plurality of channel regions is prepared so that the on-state resistance of the device is reduced even when the maximum voltage applied to a gate of the device is limited.

Furthermore, a method for manufacturing a silicon carbide semiconductor device includes the steps of: preparing a semiconductor substrate, which includes: a substrate made of silicon carbide and having a first conductive type; a first semiconductor layer disposed on the substrate, having the first conductive type, and made of silicon carbide with a low impurity concentration lower than the substrate; and a second semiconductor layer having a second conductive type, made of silicon carbide, and providing a first gate layer; forming a trench on a surface of the semiconductor substrate to penetrate the second semiconductor layer and to reach the first semiconductor layer; forming a first channel layer having the first conductive type on an inner wall of the trench and on the second semiconductor layer; forming a second gate layer having the second conductive type on a sidewall of the trench through the first channel layer; forming a second channel layer having the first conductive type on the sidewall of the trench through the first channel layer and the second gate layer and on and the second gate layer and on a bottom of the trench through the first channel layer; forming a third gate layer having the second conductive type on an inner wall of the trench through the second channel layer; and forming a source layer on a part of the surface of the semiconductor substrate corresponding to the second channel layer so that the source layer connects to the second channel layer electrically, and on another part of the surface of the semiconductor substrate corresponding to the first channel layer so that the source layer connects to the first channel layer electrically, wherein the source layer has the first conductive type and has a high impurity concentration higher than the second channel layer.

The above method provides the silicon carbide semiconductor device, which includes a plurality of channel layers disposed in each cell of the J-FET. Therefore, when the J-FET is operated, a plurality of channel regions is prepared so that the on-state resistance of the device is reduced even when the maximum voltage applied to a gate of the device is limited.

BRIEF DESCRIPTION OF THE DRAWINGS

The above and other objects, features and advantages of the present invention will become more apparent from the following detailed description made with reference to the accompanying drawings. In the drawings:

FIGS. 13A to 13F are cross sectional views showing a manufacturing method of the silicon carbide semiconductor device according to the first embodiment;

DETAILED DESCRIPTION OF THE PREFERRED EMBODIMENTS

First Embodiment

Figure 1:
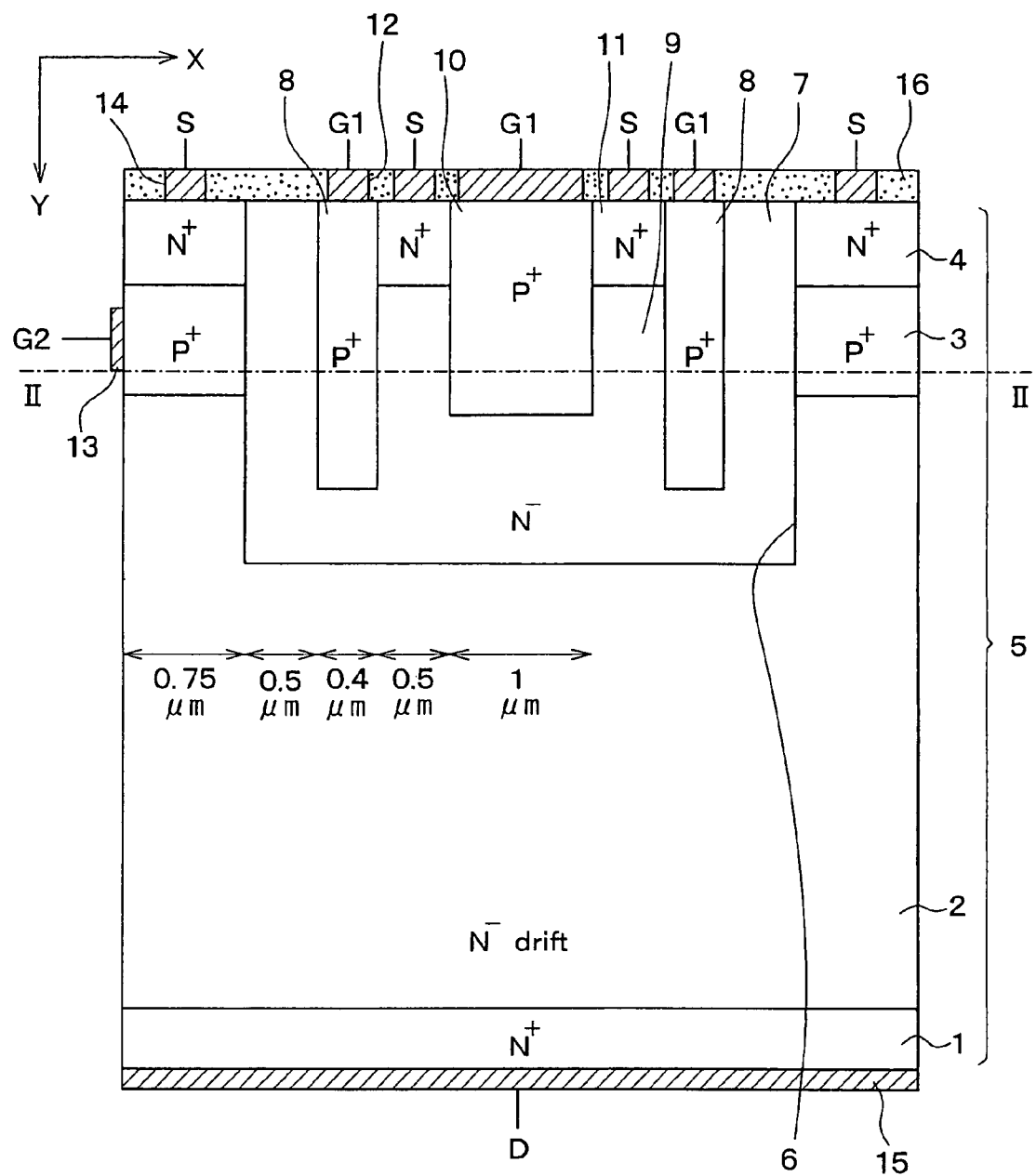
FIG. 1 is a cross sectional view showing a silicon carbide semiconductor device according to a first embodiment of the present invention.

A silicon carbide semiconductor device according to a first embodiment of the present invention is explained as follows. FIG. 1 is a cross sectional view showing the silicon carbide semiconductor device according to this embodiment. This drawing shows two cells of J-FETs, which are formed in a cell portion of the silicon carbide semiconductor device. As shown in this drawing, each cell is disposed axisymmetrically in a right side or a left side of the drawing. The constitution of the silicon carbide semiconductor device is explained as follows with reference to this drawing.

As shown in FIG. 1, the silicon carbide semiconductor device includes an $N^+$ conductive type substrate (i.e., a substrate) 1, an $N^-$ conductive type drift layer (i.e., the first semiconductor layer) 2, a $P^+$ conductive type layer 3, and an $N^+$ conductive type layer 4. The $N^+$ conductive type substrate 1, the $N^-$ conductive type drift layer 2, the $P^+$ conductive type layer 3, and the $N^+$ conductive type layer 4 are made of silicon carbide. They provide a semiconductor substrate 5.

In the semiconductor substrate 5, a cell portion (i.e., a J-FET formed region) is formed. The cell portion includes multiple J-FETs. On a principal surface of the semiconductor substrate 5 in the cell portion, a trench is disposed to extend in a predetermined direction so that the trench 6 penetrates the $N^+$ conductive type layer 4 and the $P^+$ conductive type layer 3 and reaches the $N^-$ conductive type drift layer 2. Specifically, the trench 6 is formed to be a striped shape, which includes multiple trenches aligned at predetermined intervals, which is not shown in FIG. 1. The first $N^-$ conductive type epitaxial layer (i.e., epi-layer) 7 is formed on an inner wall of each trench 6. The first $N^-$ conductive type epi-layer 7 has a thickness of 0.5 µm and provides the first channel layer.

The first $P^+$ conductive type layer 8 is deposited on a surface of each sidewall of the first $N^-$ conductive type epi-layer 7. The surface of each sidewall of the epi-layer 7 is parallel to an extending direction of the trench 6 (i.e., a longitudinal direction of the trench 6). The first $P^+$ conductive type layer 8 has a thickness of 0.4 µm, which is thinner than the first $N^-$ conductive type epi-layer 7.

The second $N^-$ conductive type epi-layer 9 is formed on a part of the first $N^-$ conductive type epi-layer 7 disposed on a bottom of the trench 6 and disposed on the surface of the $P^+$ conductive type layer 8. The second $N^-$ conductive type epi-layer 9 has a thickness almost equal to the $N^-$ conductive type epi-layer 7. Further, the second $P^+$ conductive type layer 10 having a thickness of 1 µm is formed on the surface of the second $N^-$ conductive type epi-layer 9. Thus, the trench 6 is embedded with them. An $N^+$ conductive type layer 11 is formed on a surface portion of the $N^-$ conductive type epi-layer 10, which is disposed between the first and second $P^+$ conductive type layers 8, 10.

In the above constitution, the $P^+$ conductive type layers 8, provide the second gate layer and the third gate layer, respectively. The $P^+$ conductive type layer 3 provides the first gate layer. The $N^+$ conductive type layers 4, 11 provide the first and second source layers, respectively.

The device further includes the first gate wire 12 and the second gate wire 13. The first gate wire 12 electrically connects to the $P^+$ conductive type layers 8, 10 for providing the second and third gate layers. The second gate wire 13 electrically connects to the $P^+$ conductive type layer 3 for providing the first gate layer. Specifically, the first gate wire 12 is formed on the surface of each $P^+$ conductive type layer 8, 10 for providing the second and third gate layers. For example, the first gate wire 12 is composed of a Ni film and an alloy film. The Ni film is made of a material capable of contacting a $P^+$ conductive type semiconductor with ohmic contact. The alloy film is made of Ni and Al, and laminated on the Ni film. Further, the second gate wire 13 is also formed on the surface of the $P^+$ conductive type layer 3 for providing the first gate layer. Specifically, the second gate wire 13 is formed on a different portion different from the drawing of FIG. 1 so that the second gate wire 13 contacts the $P^+$ conductive type layer 3 through a contact hole formed in the $N^+$ conductive type layer 4 for providing the $N^+$ conductive type source layer.

Further, a source wire 14 is formed on the surface of the $N^+$ conductive type layer 4 for providing the $N^+$ conductive type source layer. The source wire 14 is made of, for example, Ni. The source wire 14 is electrically separated from the first and second gate wires 12, 13 with an interlayer insulation film 16.

A drain electrode 15 is formed on a backside of the semiconductor substrate 5. The drain electrode 15 electrically connects to the $N^+$ conductive type substrate 1. Thus, the silicon carbide semiconductor device with a cell portion having multiple J-FETs is provided.

Next, a relationship of an impurity concentration in each part of the silicon carbide semiconductor device having the above constitution is explained as follows with reference to the drawings of FIGS. 2 and 3.

Figure 2:
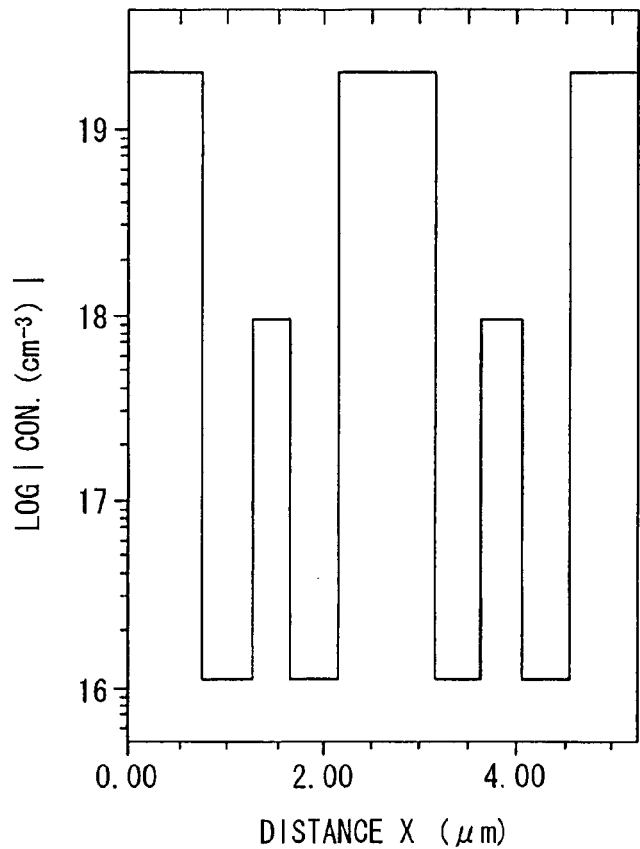
FIG. 2 is a graph showing a relationship between an impurity concentration and a position disposed on line II-II in FIG. 1.
Figure 3:
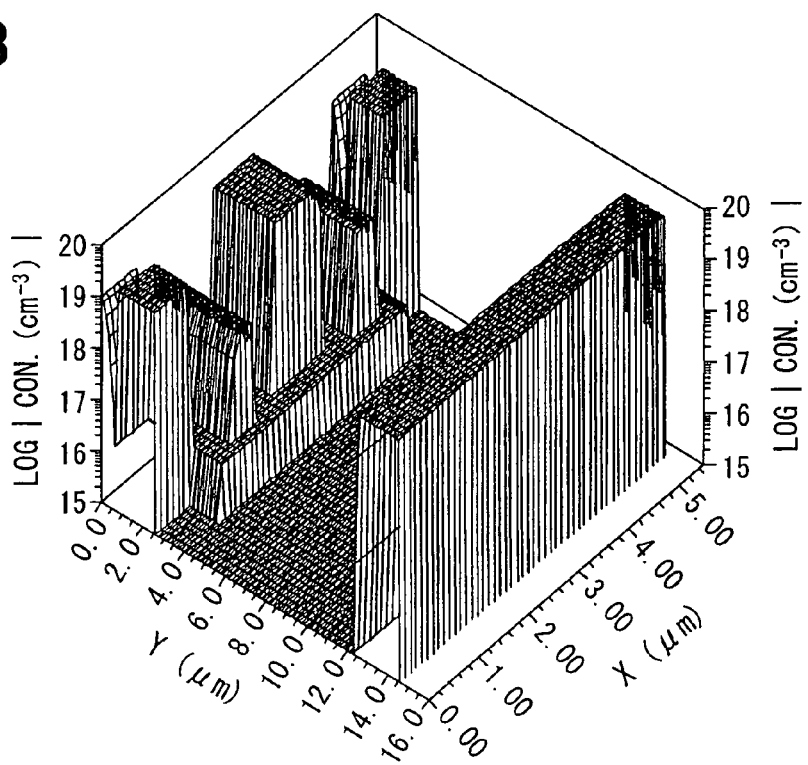
FIG. 3 is a graph having a X-axis defined as a horizontal direction shown in FIG. 1, a Y-axis defined as a thickness direction shown in FIG. 1, and a Z-axis defined as the impurity concentration and showing a relationship between the impurity concentration and the position of the cross section of the device shown in FIG. 1.

FIG. 2 is a graph showing an impurity concentration in each part of the silicon carbide semiconductor device shown in FIG. 1. Specifically, FIG. 2 shows a cross section of the device taken along line II-II crossing the $N^-$ conductive type epi-layer 9 for providing the channel layer, the line being parallel to a planar direction (i.e., a horizontal direction X) of the semiconductor substrate 5. Thus, FIG. 2 shows a relationship between a distance from a left side of the device in FIG. 1 and the impurity concentration. FIG. 3 has a X-axis defined as a planar direction of the semiconductor substrate 5 shown in FIG. 1, a Y-axis defined as a thickness direction shown in FIG. 1, and a Z-axis defined as the impurity concentration in each part.

As shown in these drawings, the $N^+$ conductive type substrate 1 has the impurity concentration equal to or higher than $1\times10^{19}$ cm$^{-3}$. The $N^-$ conductive type drift layer 2 has the impurity concentration about $1\times10^{15}$ cm$^{-3}$. The $P^+$ conductive type layer 3 has the impurity concentration about $5\times10^{19}$ cm$^{-3}$, and the $N^+$ conductive type layer 4 has the impurity concentration about $5\times10^{19}$ cm$^{-3}$.

Further, the $P^+$ conductive type layer 8 has the impurity concentration about $1\times10^{18}$ cm$^{-3}$, and the $P^+$ conductive type layer 10 has the impurity concentration about $5\times10^{19}$ cm$^{-3}$, which is higher than the $P^+$ conductive type layer 8. Furthermore, the $N^-$ conductive type epi-layers 7, 9 have the impurity concentration about $1\times10^{16}$ cm$^{-3}$.

In the above silicon carbide semiconductor device having the above constitution, the J-FET formed in the cell portion operates with a normally off operation. This operation is controlled by an applied voltage applied to the first and second gate wires 12, 13 so that the operation is performed on the basis of a multi gate operation described as follows.

The extension of the depletion layer extending from both of the $P^+$ conductive type layers 3, 8 as the first and the second gate layers to the $N^-$ conductive type epi-layers 7, 9 is controlled by a potential of the first and second gate wires 12, 13, respectively. For example, when no voltage is applied to the first and second gate wires 12, 13, the $N^-$ conductive type epi-layers 7, 9 are pinched off by the depletion layer extending from the P⁺ conductive type layers 3, 8, 10. Thus, the current between a source and a drain of the device turns off. This is, no current flows between the source S and the drain D.

When a forward bias is applied between the P⁺ conductive type layers 3, 8 and the N⁻ conductive type epi-layer 7, the extension of the depletion layer extending to the N⁻ conductive type epi-layer 7 becomes smaller. Thus, the channel is formed so that the current flows between the source S and the drain D.

As described above, the silicon carbide semiconductor device according to this embodiment can show the following effect.

(1) In the silicon carbide semiconductor device according to this embodiment, portions of the N⁻ conductive type epi-layers 7, 9 in the J-FET, which are disposed between the P⁺ conductive type layer 3 and the P⁺ conductive type layer 8 and between the P⁺ conductive type layer 8 and the P⁺ conductive type layer 10, work as a channel region. Therefore, one cell has two channel regions (In FIG. 1, two cells include four channel regions totally). Thus, a multi-channel type J-FET having multiple channel regions in one cell is provided.

Therefore, the on-state resistance of the device according to this embodiment can be reduced by an increase of the number of the channel regions, compared with a conventional silicon carbide semiconductor device with a conventional J-FET having one channel region in one cell.

Further, in the silicon carbide semiconductor device according to this embodiment, the impurity concentrations of the N⁻ conductive type epi-layers 7, 9 can be increased, compared with the conventional silicon carbide semiconductor device with the conventional J-FET having only one channel region, since the device includes multiple channel regions.

Specifically, to provide a normally off type J-FET, it is required to pinch off the N⁻ conductive type epi-layers 7, 9 by the depletion layer extending from the P⁺ conductive type layers 3, 8, 10 when no voltage is applied to the first and second gate wires 12, 13. In this case, the extension of the depletion layer extending from the P⁺ conductive type layers 3, 8, 10 depends on the impurity concentration in the N⁻ conductive type epi-layers 7, 9. Therefore, the extension of the depletion layer becomes larger as the impurity concentration in the N⁻ conductive type epi-layers 7, 9 becomes lower.

Therefore, the N⁻ conductive type epi-layers 7, 9 is easily pinched off as the impurity concentration in the N⁻ conductive type epi-layers 7, 9 becomes lower. However, the inner resistance in the N⁻ conductive type epi-layers 7, 9 becomes larger so that the on-state resistance of the silicon carbide semiconductor device becomes higher. Accordingly, the impurity concentration of the N⁻ conductive type epi-layers 7, 9 is determined on the basis of a trade-off relationship between capability of pinching off and reduction of the on-state resistance as low as possible.

On the other hand, since the silicon carbide semiconductor device according to this embodiment has the multi-channel type J-FET, the total channel width of the device is wider than the conventional silicon carbide semiconductor device even if the width of the N⁻ conductive type epi-layers 7, 9 in the device according to this embodiment become narrower than the conventional silicon carbide semiconductor device. Therefore, it is possible to set the impurity concentration in the N⁻ conductive type epi-layers 7, 9 in the device according to this embodiment to be higher than the conventional silicon carbide semiconductor device. Thus, the on-state resistance in the silicon carbide semiconductor device can be reduced.

(2) In the silicon carbide semiconductor device according to this embodiment, the P⁺ conductive type layer 8 for providing two gate layers is formed additionally between the N⁻ conductive type epi-layers 7, 9 as two channel layers. A RESURF (REduced SURface Field) effect can be improved by controlling the impurity concentration of the P⁺ conductive type layer 8 and the impurity concentration of each N⁻ conductive type epi-layer 7, 9. This effect is explained with reference with the drawing of FIG. 4.

Figure 4:
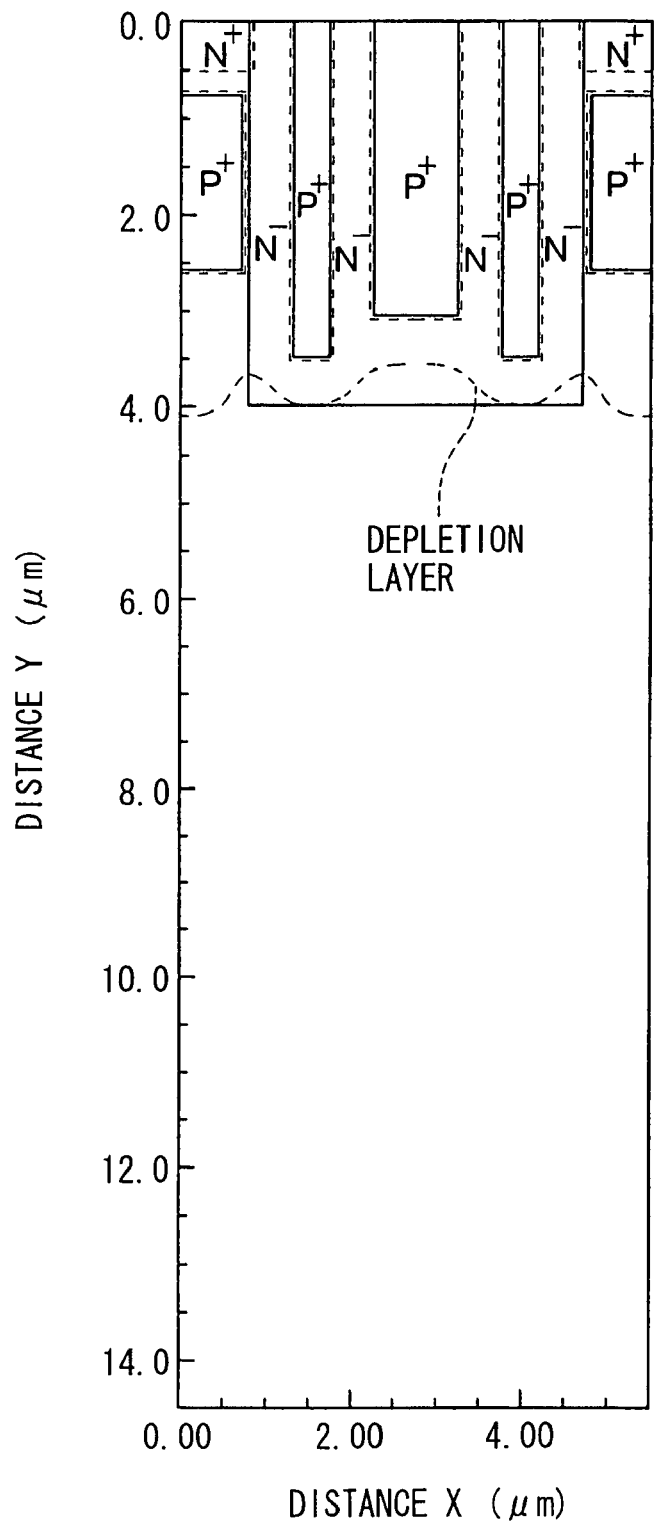
FIG. 4 is a cross sectional view of the device showing a simulation result of an extension of a depletion layer in the silicon carbide semiconductor device shown in FIG. 1 when no voltage is applied to the gate wires.

FIG. 4 shows a simulation result of the extension of the depletion layer by using a simulation software of MEDICI when no voltage is applied to the gate wires 12, 13 (i.e., when the potential is zero) in the silicon carbide semiconductor device. Specifically, FIG. 4 is a cross sectional view of the device shown in FIG. 1. As shown in the drawing, the N conductive type layers 7, 9 are pinched off by the depletion layer extending from the P⁺ conductive type layers 3, 8, 10 so that the J-FET becomes the normally off type J-FET. The depletion layer near the bottom of the N⁻ conductive type epi-layer 7 becomes almost parallel to a horizontal direction of the semiconductor substrate 5.

Even if the reverse bias is generated by the depletion layer, the electric field generated by the reverse bias is pushed down and disposed under the P⁺ conductive type layer 8. Thus, the electric field is suppressed to move up any more. Thus, the electric field can be prevented from penetrating into the N⁻ conductive type epi-layers 7, 9. This protection effect of the electric field from penetrating is defined as the RESURF effect. By using the RESURF effect, the silicon carbide semiconductor device having a high withstand voltage is obtained. Accordingly, the channel layer in the device is protected when the reverse bias is applied to the device.

Thus, since the electric field is prevented from penetrating into the N⁻ conductive type epi-layers 7, 9 as the channel layer by the RESURF effect, the impurity concentration of the N⁻ conductive type epi-layers 7, 9 can be increased. Thus, the on-state resistance of the silicon carbide semiconductor device can be reduced.

Although each P⁺ conductive type layer 8, 10 electrically connects to the first gate wire 12 in the device according to this embodiment, both layers 8, 10 can become a floating state, in which the layers 8, 10 are not connected other electrodes electrically. Even when the layers 8, 10 are in the floating state, the above described RESURF effect can be obtained.

(3) In the silicon carbide semiconductor device according to this embodiment, the N⁻ conductive type epi-layers 7, 9 are completely or partially depleted by the depletion layer extending from the P⁺ conductive type layers 8, 10 even when the silicon carbide semiconductor device is broken down in a case where the impurity concentration in the P⁺ conductive type layers 8, 10 is appropriately selected. Thus, even when the reverse bias is applied to the device, the electric field generated by the reverse bias can be prevented from penetrating into the N⁻ conductive type epi-layers 7, 9. Accordingly, the silicon carbide semiconductor device having the high withstand voltage is obtained. Accordingly, the channel layer in the device is protected when the reverse bias is applied to the device.

Here, the withstand voltage of the silicon carbide semiconductor device is calculated to be in a range between 100V and 150V, for reference. This withstand voltage is obtained by the simulation result in a case where the impurity concentration of the N⁻ conductive type epi-layers 7, 9 and the impurity concentration of the P⁺ conductive type layers 8, 10 are optimized appropriately.

(4) In the silicon carbide semiconductor device according to this embodiment, since the width of the N⁻ conductive type epi-layers 7, 9 as the channel layer can be narrowed, a cell pitch, i.e., the width of the cell can also be narrowed narrower than the conventional silicon carbide semiconductor device. Specifically, when the cell pitch of the conventional silicon carbide semiconductor device is 7 μm, the cell pitch of the silicon carbide semiconductor device according to this embodiment can become 5.3 μm. Thus, the dimensions of the silicon carbide semiconductor device are reduced.

Next, in the silicon carbide semiconductor device according to this embodiment, the break down characteristic of the silicon carbide semiconductor device having different impurity concentration of each part and having different dimensions of each part has studied. The result is described as follows.

Figure 5:
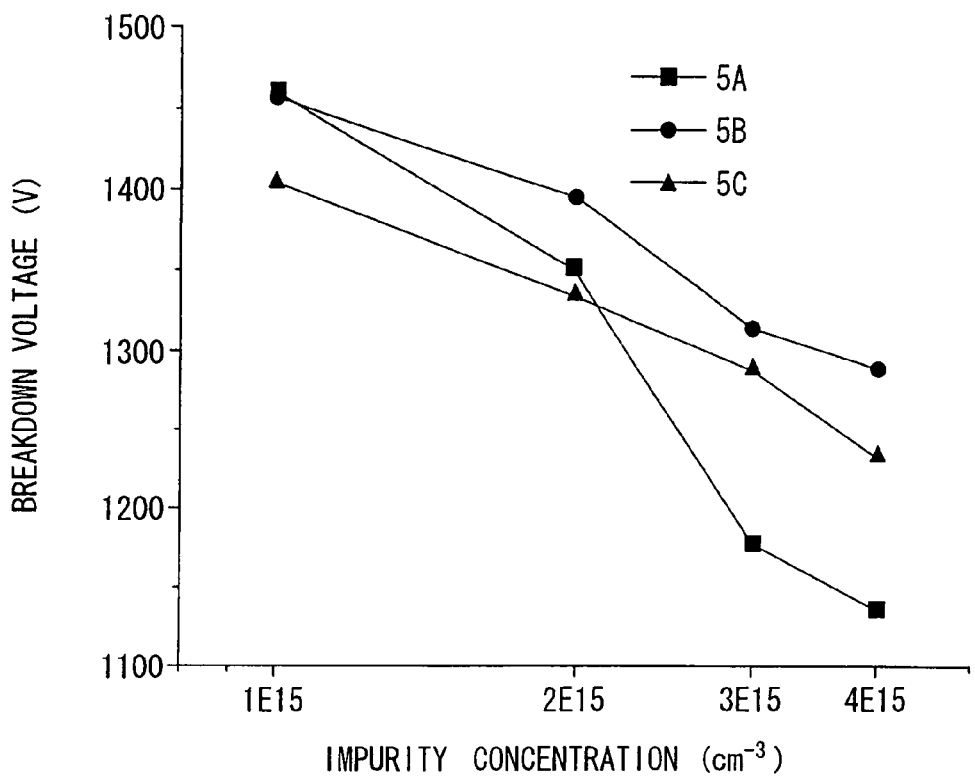
FIG. 5 is a graph showing a simulation result of a relationship between the impurity concentration in the N$^-$ conductive type drift layer and a break-down-voltage of the silicon carbide semiconductor device.

FIG. 5 shows a simulation result of a relationship between the impurity concentration of the N⁻ conductive type drift layer 2 and the break down voltage. Here, the impurity concentration of each N⁻ conductive type epi-layer 7, 9 as the channel layer is $1\times10^{16}$ cm$^{-3}$, and the width of each epi-layer 7, 9 is 0.5 μm. The thickness of the N⁻ conductive type drift layer 2 is 9 μm. The width of each P⁺ conductive type layer 8, 10 is 0.4 μm. When the impurity concentration of each P⁺ conductive type layer 8, 10 is $1\times10^{17}$ cm$^{-3}$, $5\times10^{17}$ cm$^{-3}$, or $1\times10^{18}$ cm$^{-3}$, each break down voltage of the device is determined. In FIG. 5, a curve 5A shows the impurity concentration of each P⁺ conductive type layer 8, 10 of $1\times10^{17}$ cm$^{-3}$, a curve 5B shows $5\times10^{17}$ cm$^{-3}$, and a curve 5C shows $1\times10^{18}$ cm$^{-3}$.

As shown in the drawing, the break down voltage becomes lower as the impurity concentration of the N⁻ conductive type drift layer 2 becomes higher. This is because the extension of the electric field in the N⁻ conductive type drift layer 2 becomes larger as the impurity concentration of the N⁻ conductive type drift layer 2 becomes higher. Therefore, it is preferred that the impurity concentration of the N⁻ conductive type drift layer 2 is set to be comparatively low. However, when the impurity concentration of the N⁻ conductive type drift layer 2 becomes lower, the on-state resistance of the silicon carbide semiconductor device becomes higher. Therefore, it is not preferred that the impurity concentration of the N⁻ conductive type drift layer 2 becomes excessively lower.

Accordingly, preferably, the impurity concentration of the N⁻ conductive type drift layer 2 is increased as high as possible, and at the same time, the break down voltage of the device becomes higher by optimizing the impurity concentration of the N⁻ conductive type drift layer 2 and the impurity concentration of the P⁺ conductive type layers 8, 10.

As shown in the drawing, in a case where the impurity concentration of each P⁺ conductive type layer 8, 10 is $5\times10^{17}$ cm$^{-3}$, the break down voltage is comparatively high even when the impurity concentration of the N⁻ conductive type drift layer 2 becomes higher. Specifically, when the impurity concentration of the N⁻ conductive type drift layer 2 becomes equal to or higher than $2\times10^{15}$ cm$^{-3}$, the difference of the break down voltage between a case where the impurity concentration of each P⁺ conductive type layer 8, 10 is $5\times10^{17}$ cm$^{-3}$ and another case where the impurity concentration is not $5\times10^{17}$ cm$^{-3}$ becomes remarkable. Thus, it is preferred that the impurity concentration of each P⁺ conductive type layer 8, 10 is set to be $5\times10^{17}$ cm$^{-3}$.

Figure 6:
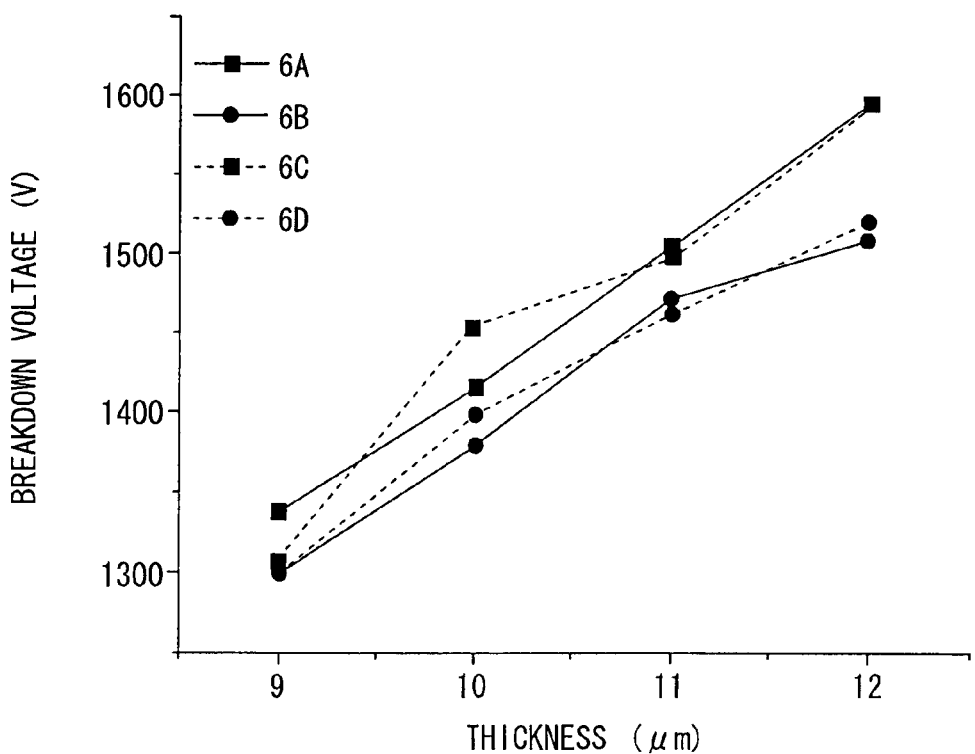
FIG. 6 is a graph showing a simulation result of a relationship between the thickness of the N$^-$ conductive type drift layer and the break-down voltage of the silicon carbide semiconductor device.

FIG. 6 is a simulation result of a relationship between the thickness of the N⁻ conductive type drift layer 2 and the break down voltage. Here, the width of each N⁻ conductive type epi-layer 7, 9 as the channel layer is 0.5 μm, and the thickness of each P⁺ conductive type layer 8, 10 is 0.4 μm. Further, the impurity concentration of each P⁺ conductive type layer 8, 10 is $5\times10^{17}$ cm$^{-3}$. When the impurity concentration of each N⁻ conductive type epi-layer 7, 9 as the N⁻ conductive type drift layer and the channel layer is changed to different values shown in the drawing, the break down voltage is calculated. In FIG. 6, a curve 6A shows the impurity concentration of the N⁻ conductive type drift layer 2 of $3\times10^{15}$ cm$^{-3}$ and the impurity concentration of each N⁻ conductive type epi-layer 7, 9 of $2\times10^{16}$ cm$^{-3}$, a curve 6B shows the impurity concentration of the N⁻ conductive type drift layer 2 of $4\times10^{15}$ cm$^{-3}$ and the impurity concentration of each N conductive type epi-layer 7, 9 of $2\times10^{16}$ cm$^{-3}$, a curve 6C shows $3\times10^{15}$ cm$^{-3}$ and $3\times10^{16}$ cm$^{-3}$, and a curve 6D shows $4\times10^{15}$ cm$^{-3}$ and $3\times10^{16}$ cm$^{-3}$.

As shown in the drawing, even if the impurity concentration of each N⁻ conductive type epi-layer 7, 9 as the channel layer is equal to or higher than $3\times10^{16}$ cm$^{-3}$, the break down voltage becomes higher when the thickness of the N⁻ conductive type drift layer 2 becomes thicker.

Figure 7:
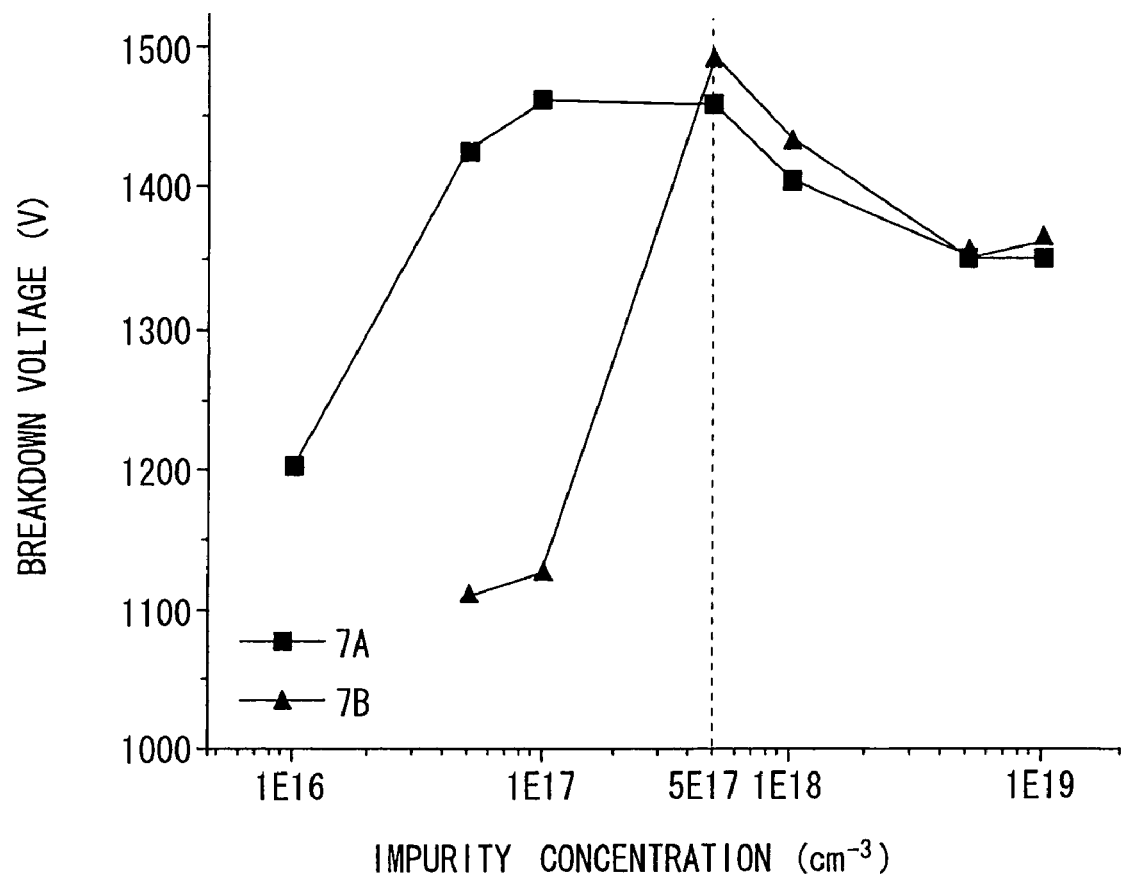
FIG. 7 is a graph showing a simulation result of a relationship between the impurity concentration of the P$^+$ conductive type layer as the gate layer and the break-down voltage of the silicon carbide semiconductor device.

FIG. 7 is a simulation result showing a relationship between the impurity concentration of the P⁺ conductive type layer 8 as the gate layer and the break down voltage. Here, the impurity concentration of the N⁻ conductive type epi-layer 7 as the outside channel layer is $1\times10^{16}$ cm$^{-3}$, and the width of the N⁻ conductive type epi-layer 7 is 0.5 μm. The impurity concentration of the N⁻ conductive type drift layer 2 is $1\times10^{15}$ cm$^{-3}$, and the thickness of the N⁻ conductive type drift layer 2 is 9 μm. The width of each P⁺ conductive type layer 8, 10 is 0.4 μm. When the impurity concentration of the N⁻ conductive type epi-layer 9 as the inside channel layer is changed from $1\times10^{16}$ cm$^{-3}$ to $3\times10^{16}$ cm$^{-3}$, the break down voltage is calculated. In FIG. 7, a curve 7A shows the impurity concentration of the N⁻ conductive type epi-layer 9 of $1\times10^{16}$ cm$^{-3}$, and a curve 7B shows $3\times10^{16}$ cm$^{-3}$.

As shown in the drawing, in a case where the impurity concentration of the N⁻ conductive type epi-layer 9 as the inside channel layer is high, the break down voltage becomes lower when the impurity concentration of the P⁺ conductive type layer 8 is low. However, when the impurity concentration of the P⁺ conductive type layer 8 is, for example, $5\times10^{17}$ cm$^{-3}$, the break down voltage becomes higher without depending on the impurity concentration of the N⁻ conductive type epi-layer 9. This phenomenon is explained as follows with reference to the drawing of FIG. 8.

Figure 8:
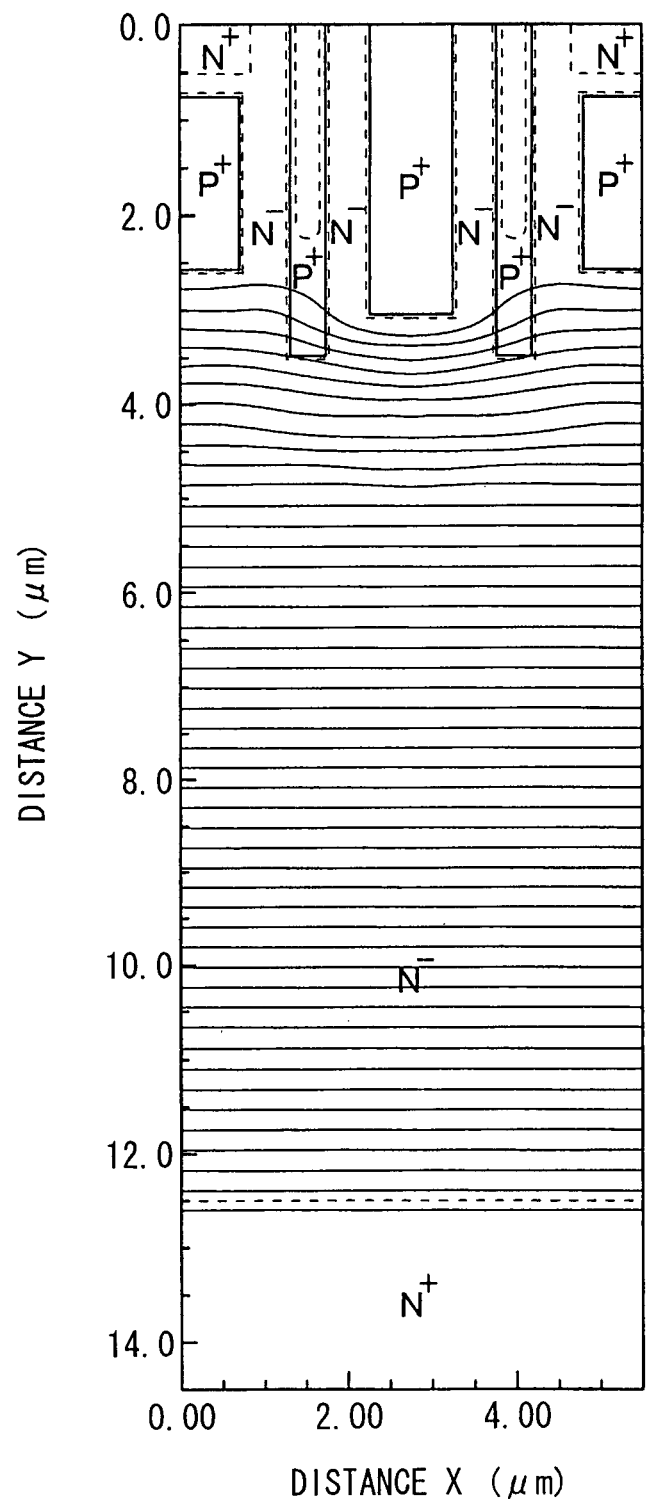
FIG. 8 is a cross sectional view of the device showing equipotential lines in an electric potential distribution and the depletion layer when the silicon carbide semiconductor device is broken down.

FIG. 8 shows the depletion layer and equipotential lines in an electric potential distribution when the silicon carbide semiconductor device is broken down. In the drawing, a broken line shows a border line of the depletion layer. A solid line aligned at almost even intervals shows the equipotential line. Specifically, FIG. 8 is a cross sectional view showing the device shown in FIG. 1.

As shown in the drawing, the equipotential line penetrates in a lower portion of the P⁺ conductive type layer 8. This shows that the electric field penetrates into the P⁺ conductive type layer 8. In view of the electric filed distribution, the equipotential line near the P⁺ conductive type layer 8 becomes almost flat since the electric field penetrates into the P⁺ conductive type layer 8. Therefore, the break down voltage becomes higher.

Further, as shown in FIG. 8, the bottom of the depletion layer shifts from the lower portion of the P⁺ conductive type layer 8 to the inside of the P⁺ conductive type layer 8. In general, when a P⁺ conductive type layer is formed to have a high impurity concentration, a break down is easily occurred at a corner of the P⁺ conductive type layer. However, in the silicon carbide semiconductor device according to this embodiment, a portion at which the break down is occurred shifts from the corner of the P+ conductive type layer 8 to the inside of the P+ conductive type layer 8.

Figure 9:
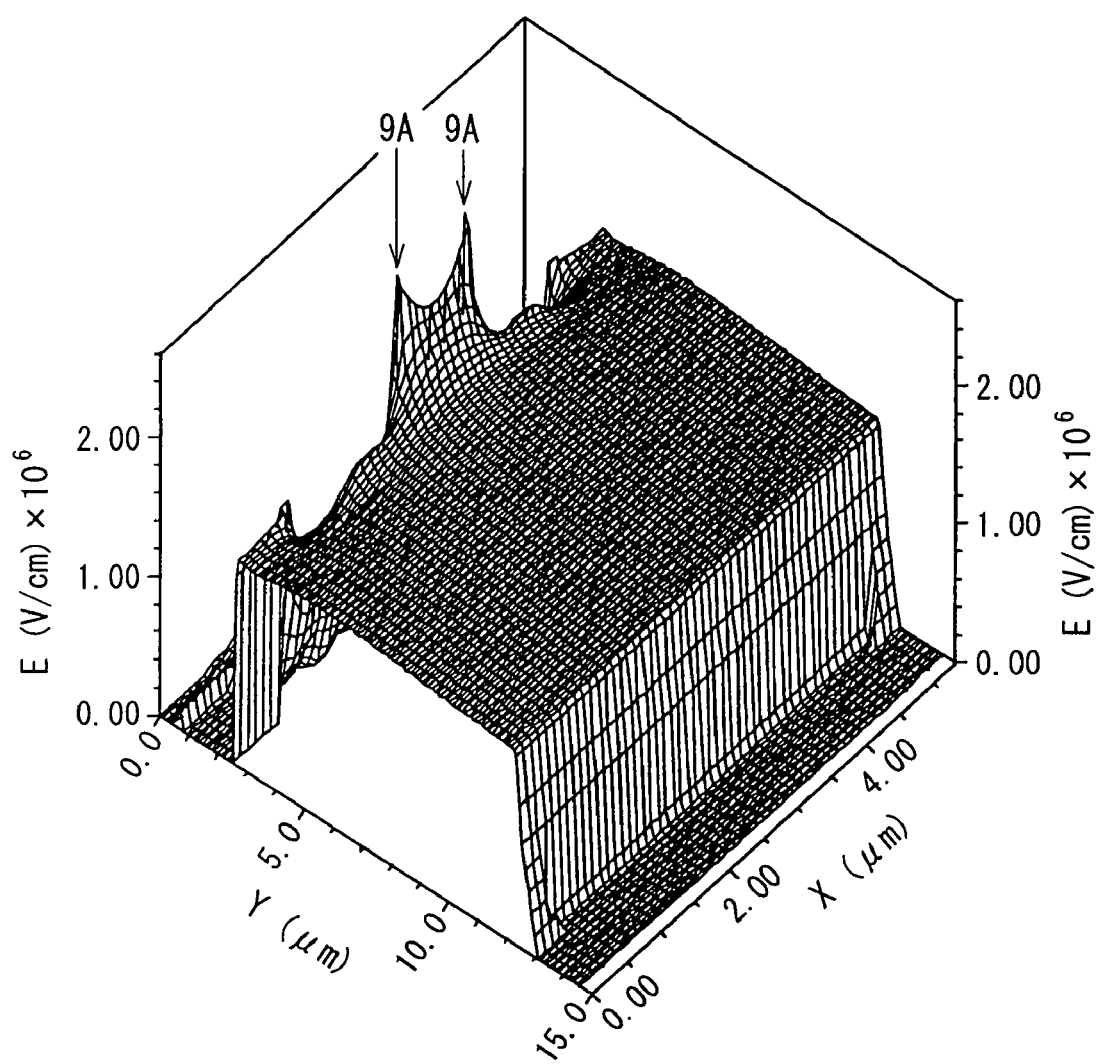
FIG. 9 is a graph having a X-axis defined as a horizontal direction shown in FIG. 1, a Y-axis defined as a thickness direction shown in FIG. 1, and a Z-axis defined as the electric field intensity in each part and showing a relationship between the electric field intensity and the position of the cross section of the device shown in FIG. 1.

This phenomenon can be also confirmed by the drawing of FIG. 9. FIG. 9 is a graph having a X-axis defined as a horizontal direction of the semiconductor substrate 5 shown in FIG. 1, a Y-axis defined as a thickness direction shown in FIG. 1, and a Z-axis defined as the electric field intensity in each part and showing the cross sectional view in FIG. 1. As shown in the drawing of FIG. 9, when a value on the Y-axis is 2.5 μm, the electric field intensity becomes maximum. This portion corresponds to the inside of the P+ conductive type layer 8, and it shows that the break down is occurred at this portion. Specifically, in FIG. 9, two peaks shown as 9A are breakdown occurrence points disposed in the P+ conductive type layer 8. Thus, since the break down is easily occurred in the inside of the P+ conductive type layer 8, the break down voltage can be increased.

Figure 10:
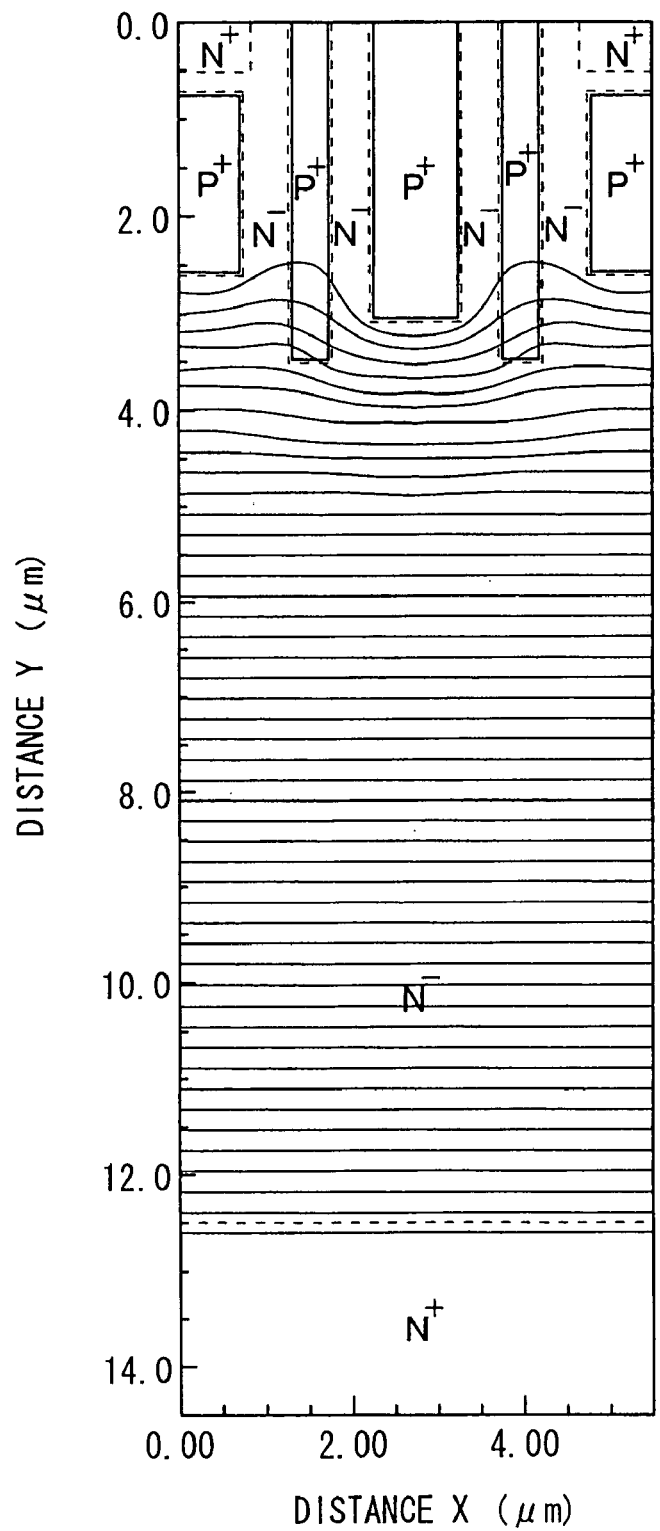
FIG. 10 is a cross sectional view of the device showing equipotential lines in an electric potential distribution and the depletion layer when the silicon carbide semiconductor device is broken down in a case where the impurity concentration of the P$^+$ conductive type layer is $1 \times 10^{16}$ cm$^{-3}$.

FIG. 10 shows an influence of the impurity concentration of the P+ conductive type layer 8 to the RESURF effect. The drawing shows the depletion layer and the equipotential line in the electric potential distribution when the silicon carbide semiconductor device is broken down in a case where the impurity concentration of the P+ conductive type layer 8 is $1\times10^{16}$ cm$^{-3}$. In the drawing, a broken line shows a border line of the depletion layer. A solid line aligned at almost even intervals shows the equipotential line.

Comparing FIG. 10 and FIG. 8, the portion, in which the equipotential line penetrates, is different. This is because the impurity concentration of the P+ conductive type layer 8 is different. Specifically, the equipotential line in FIG. 10 penetrates deeply in the P+ conductive type layer 8 just like protruding inside of the layer 8. Thus, the equipotential line in FIG. 10 bends at the corner of each P+ conductive type layer 3, 10.

In the above situation, the electric filed concentrates at the corner of each P+ conductive type layer 3, 10 so that the withstand voltage of the silicon carbide semiconductor device is reduced. Accordingly, it is required that the impurity concentration of the P+ conductive type layer 8 is optimized, for example, to be $5\times10^{16}$ cm$^{-3}$, so that the RESURF effect can be obtained more effectively.

Figure 11:
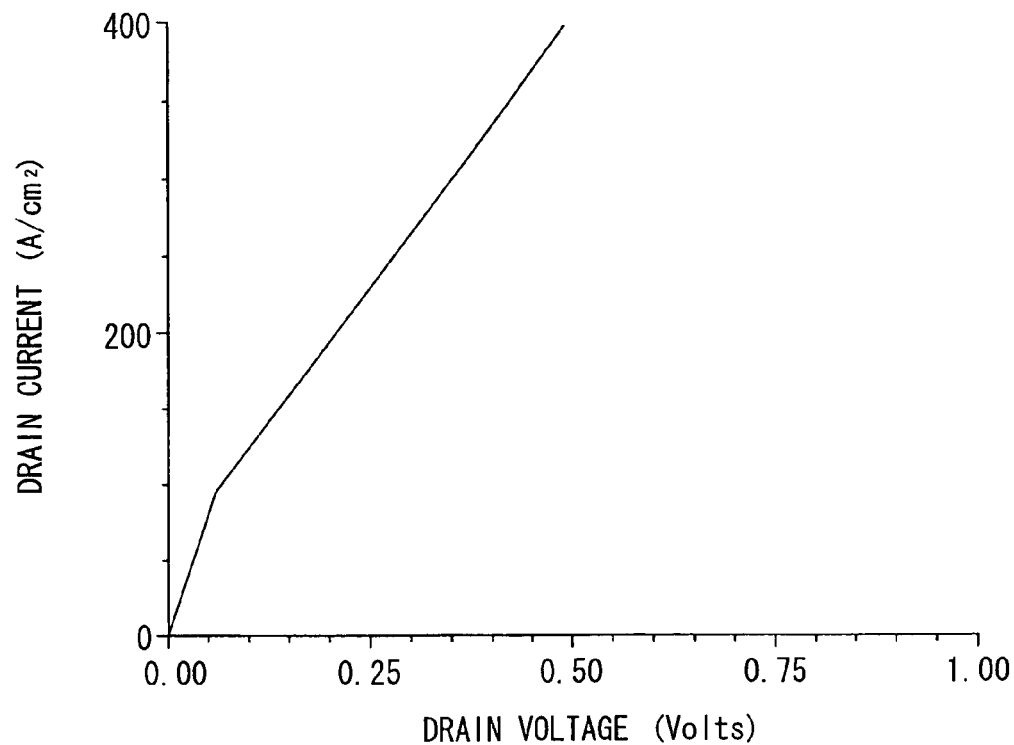
FIG. 11 is a graph showing a relationship between a drain voltage and a drain current of the silicon carbide semiconductor device.

FIG. 11 shows a characteristic of the on-state resistance in the silicon carbide semiconductor device according to this embodiment. Specifically, FIG. 11 shows the characteristics of the drain current in various drain voltage. In the drawing, the impurity concentration of the N− conductive type drift layer 2 is $4\times10^{15}$ cm$^{-3}$, and the thickness of the N− conductive type drift layer 2 is 9 μm. The impurity concentration of the P+ conductive type layer 8 is $5\times10^{17}$ cm$^{-3}$, and the width of the P+ conductive type layer 8 is 0.5 μm. The impurity concentration of each N− conductive type epi-layer 7, 9 is $3\times10^{16}$ cm$^{-3}$, and the width of each N− conductive type epi-layer 7, 9 is 1.8 μm.

When a gate voltage of 2.5V is applied to each gate wire 12, 13, the drain current per unit area becomes 200 A/cm$^2$. Thus, the on-state resistance of the J-FET in the silicon carbide semiconductor device is calculated as 2.6 mΩ·cm$^2$. This value is about a half of the on-state resistance in the conventional silicon carbide semiconductor device. Thus, it is confirmed that the on-state resistance of the J-FET in the silicon carbide semiconductor device according to this embodiment is reduced.

Further, the on-state resistance depends on the impurity concentration and the thickness of the N− conductive type drift layer 2. For example, the on-state resistance becomes larger as the N− conductive type drift layer 2 becomes thicker and/or as the impurity concentration of the drift layer 2 becomes higher. Therefore, it is required to optimize the thickness of the N− conductive type drift layer 2 and the impurity concentration appropriately.

Figure 12:
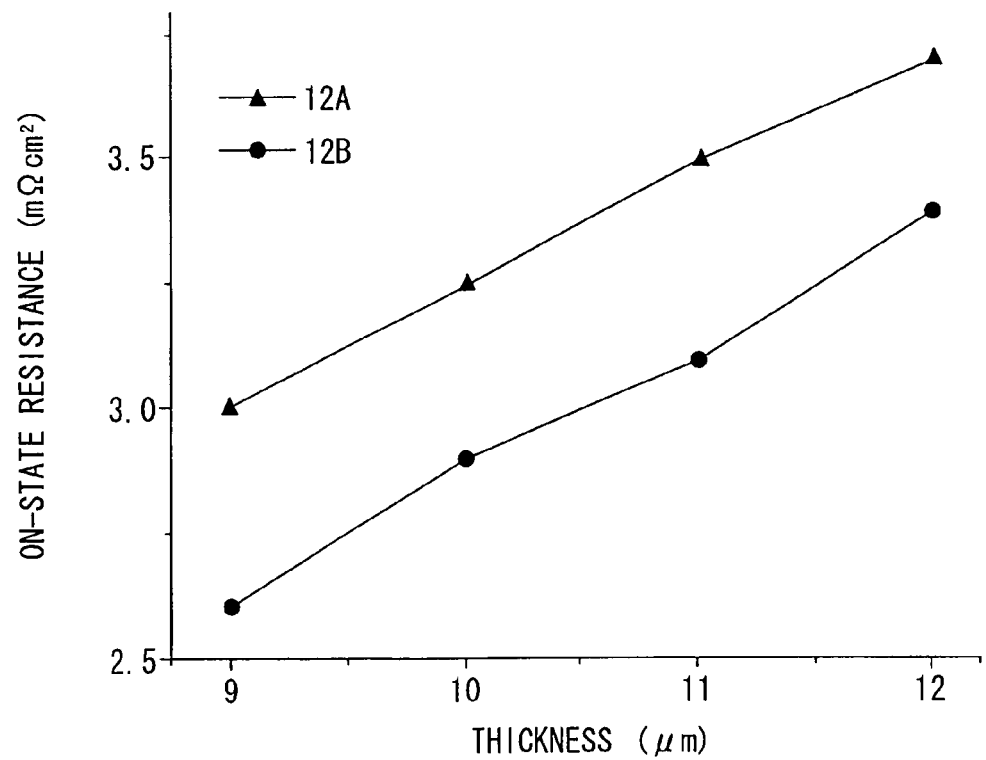
FIG. 12 is a graph showing a relationship between the thickness of the N$^-$ conductive type drift layer and the on-state resistance of the silicon carbide semiconductor device.

FIG. 12 shows a relationship between the thickness of the N− conductive type drift layer 2 and the on-state resistance. Specifically, in a case where the impurity concentration of each N− conductive type epi-layer 7, 9 is $2\times10^{16}$ cm$^{-3}$ or $3\times10^{16}$ cm$^{-3}$, the on-state resistance is calculated when the thickness of the N− conductive type drift layer 2 is changed. In FIG. 12, a curve 12A shows the impurity concentration of each N− conductive type epi-layer 7, 9 of $2\times10^{16}$ cm$^{-3}$, and a curve 12B shows $3\times10^{16}$ cm$^{-3}$.

As shown in the drawing, the on-state resistance becomes lower as the impurity concentration of each N− conductive type epi-layer 7, 9 as the channel layer becomes higher. In the silicon carbide semiconductor device according to this embodiment, since it is possible to increase the impurity concentration of each N− conductive type epi-layer 7, 9, the on-state resistance can be reduced. Thus, when the impurity concentration of each N− conductive type epi-layer 8, 9 is high, the on-state resistance can be reduced about 18% lower than the conventional silicon carbide semiconductor device.

Here, it is confirmed that the on-state resistance can be reduced to the same level as a case where the P+ conductive type layers 8, 10 connect to the first gate wire 10 electrically even when the P+ conductive type layer 8, 10 are in the floating state.

Next, a manufacturing method for the silicon carbide semiconductor device according to this embodiment is described. FIGS. 13A to 13F show manufacturing processes of the silicon carbide semiconductor device according to this embodiment. The method is explained with reference to the drawings.

In a manufacturing process shown in FIG. 13A, the semiconductor substrate 5 is prepared in such a manner that the N− conductive type drift layer 2 and the P+ conductive type layer 3 are formed on the surface of the N+ conductive type substrate 1 by the epitaxial growth method. The process in FIG. 13A is defined as a double epitaxial substrate forming step.

In a manufacturing process shown in FIG. 13B, the trench 6 is formed on the principal surface of the semiconductor substrate 5 to penetrate the N+ conductive type layer 4 and the P+ conductive type layer 3 and to reach the N− conductor type drift layer 2. The process in FIG. 13B is defined as a RIE etching step so that the trench 6 is formed.

In a manufacturing process shown in FIG. 13C, the N− conductive type epi-layer 7 is formed on the whole surface of the semiconductor substrate 5 including the inner wall of the trench 6, and then, the P+ conductive type layer 8 is formed on the surface of the N− conductive type epi-layer 7. The process in FIG. 13C is defined as an N conductive type epi-layer and a P conductive type epi-layer forming step.

In a manufacturing process shown in FIG. 13D, a part of the P+ conductive type layer 8 disposed on the outside of the trench 6 and another portion of the P+ conductive type layer 8 disposed on the bottom of the trench 6 are removed by a RIE (i.e., reactive ion etching) method. The part and the other part of the P+ conductive type layer 8 are parallel to the principal surface of the semiconductor substrate 5. Thus, the P+ conductive type layer 8 only remains on the sidewall of the trench 6. The process in FIG. 13D is defined as a RIE etching step.

Next, in a manufacturing process shown in FIG. 13E, the N− conductive type epi-layer 9 is formed on the surface of the semiconductor substrate 5 including the inside of the trench 6. Specifically, the N− conductive type epi-layer 9 is formed on the surfaces of the N− conductive type layer 7 and the P+ conductive type layer 8. Then, the P+ conductive type layer 10 is formed on the surface of the N⁻ conductive type epi-layer 9 so that the inside of the trench 6 is completely embedded. The process in FIG. 13E is defined as an N conductive type epi-layer and a P conductive type epi-layer forming step.

In a manufacturing process shown in FIG. 13F, the surface of the N⁺ conductive type layer 5 is exposed by an etch-back method. The process in FIG. 13F is defined as an etch back step.

After that, an interlayer insulation film forming process, a contact hole forming process, a wire forming process, a protection film forming process and the like are performed so that the silicon carbide semiconductor device according to this embodiment is completed.

Second Embodiment

Figure 14:
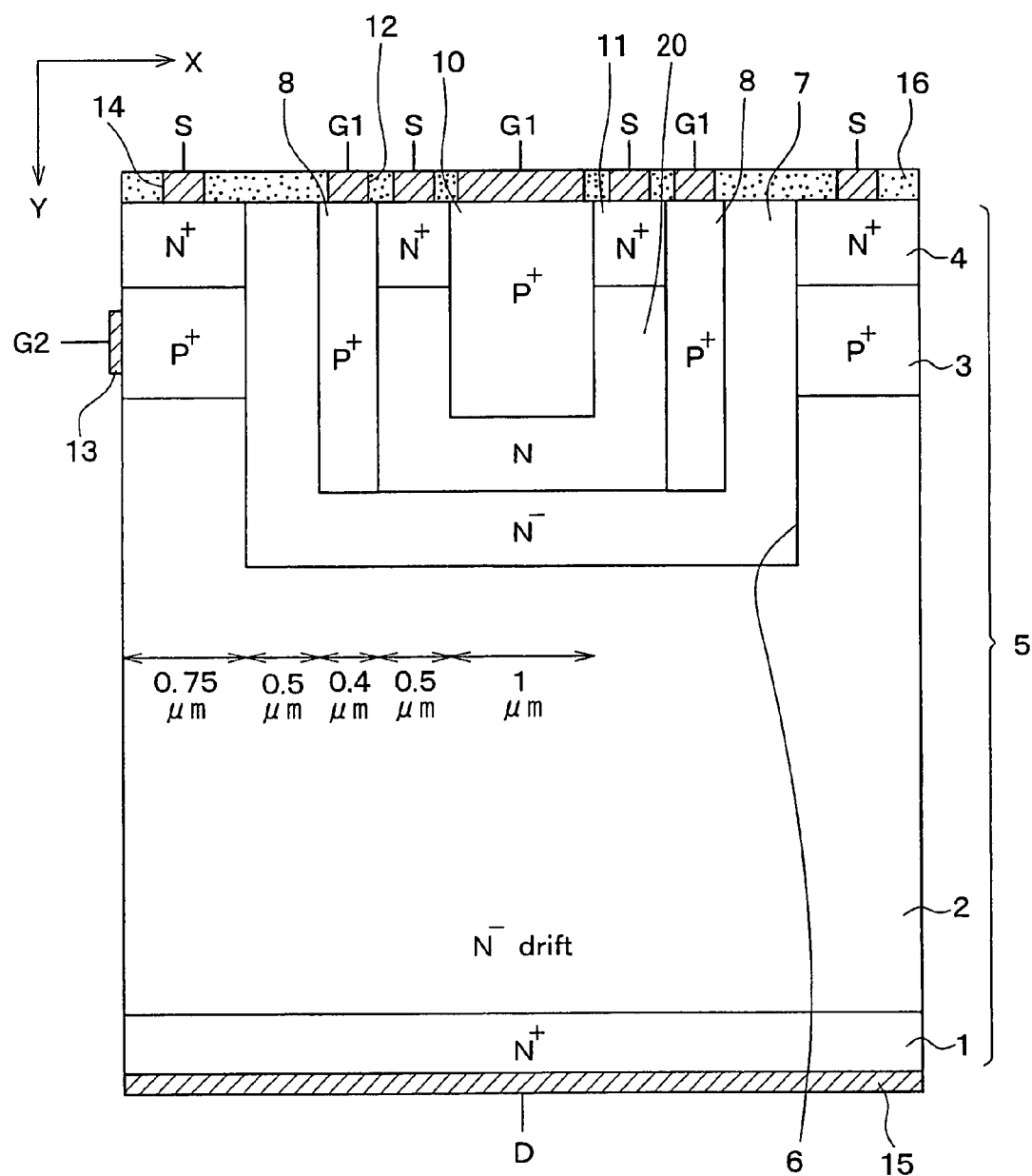
FIG. 14 is a cross sectional view showing a silicon carbide semiconductor device according to a second embodiment of the present invention.

A second embodiment of the present invention is described. FIG. 14 is a cross sectional view showing a silicon carbide semiconductor device according to this embodiment. In the second embodiment, the impurity concentration of the N⁻ conductive type layer 9 is different from the impurity concentration of the N⁻ conductive type epi-layer 7, compared with the first embodiment.

Specifically, as shown in FIG. 14, the N⁻ conductive type layer 9 shown in FIG. 1 is replaced to an N conductive type layer 20. The impurity concentration of the N⁻ conductive type epi-layer 20 becomes higher than the N⁻ conductive type epi-layer 7. In this case, the inner resistance of the N⁻ conductive type epi-layer 20 can be much reduced so that the on-state resistance is much reduced.

In the silicon carbide semiconductor device having the above constitution, the deposition process of the N⁻ conductive type epi-layer 9 shown in FIG. 13E is replaced to a deposition process of the N conductive type epi-layer 20 so that the N conductive type epi-layer is formed by using an N conductive type film having a high impurity concentration. Thus, the device is manufactured.

As described above, the electric field disposed under the N⁻ conductive type epi-layer 7 is prevented from moving up to the surface of the semiconductor substrate 5 by the RESURF effect. Therefore, the withstand voltage of the silicon carbide semiconductor device is not reduced substantially even when the impurity concentration of the N⁻ conductive type epi-layer 20 becomes higher.

Third Embodiment

Figure 15:
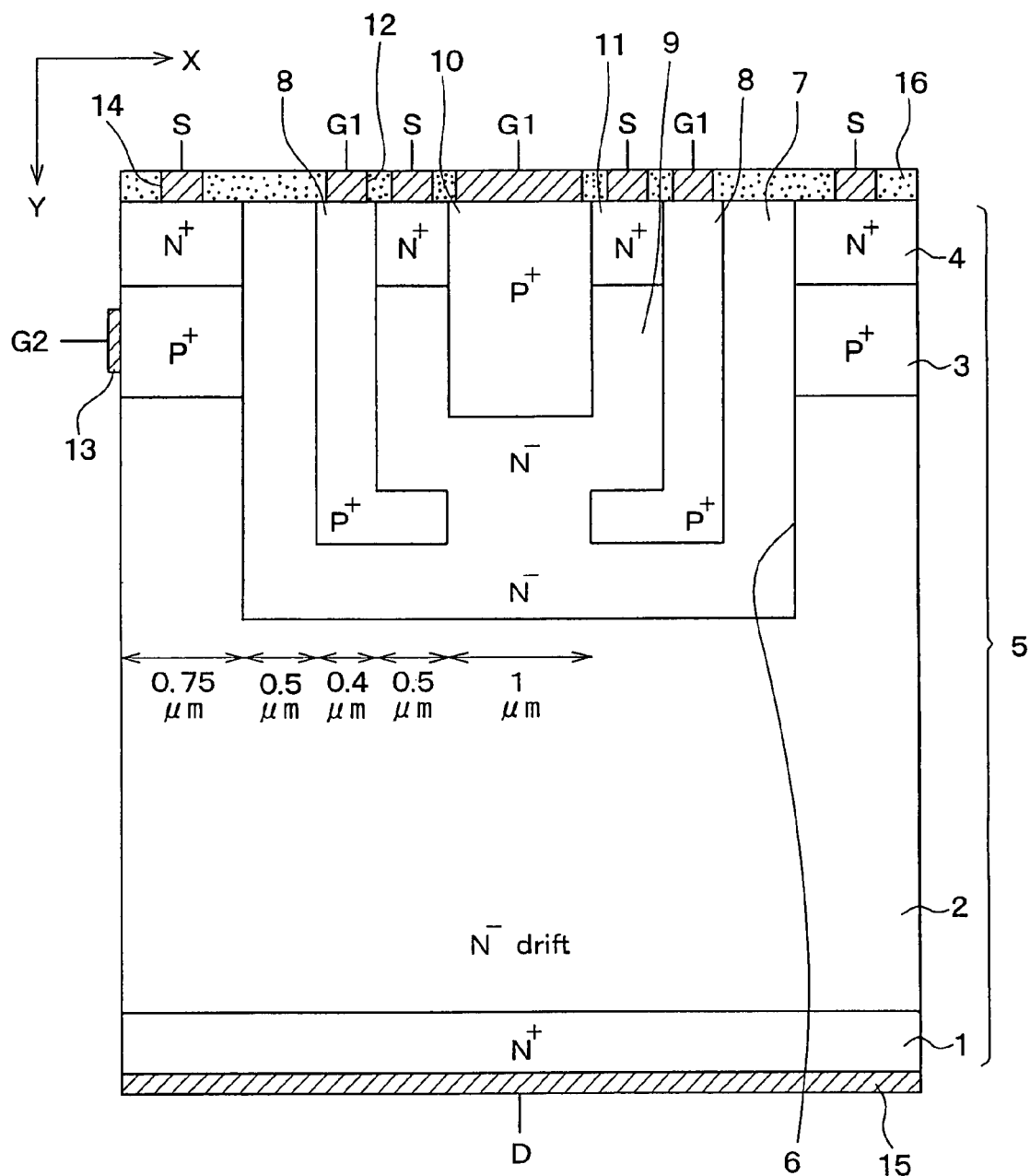
FIG. 15 is a cross sectional view showing a silicon carbide semiconductor device according to a third embodiment of the present invention.

A third embodiment of the present invention is described. FIG. 15 is a cross sectional view showing a silicon carbide semiconductor device according to this embodiment. In the third embodiment, the shape of the P⁺ conductive type layer 8 shown in FIG. 14 is different, compared with the first and second embodiments.

Specifically, in the silicon carbide semiconductor device according to this embodiment, the P⁺ conductive type layer 8 is formed not only on a part of the N⁻ conductive type epi-layer 7 disposed on the sidewall of the trench 6 but also on another part of the N⁻ conductive type epi-layer 7 disposed on the bottom of the trench 6. The P⁺ conductive type layer 8 is separated each other at the center of the N⁻ conductive type epi-layer 7 disposed on the bottom of the trench 6 so that the P⁺ conductive type layer 8 has a L-shaped cross section shown in FIG. 15.

When the P⁺ conductive type layer 8 has the above shape, the electric field is prevented from penetrating into the N⁻ conductive type epi-layer 9 by a protrusion of the P⁺ conductive type layer 8 protruded to the N⁻ conductive type epi-layer 9. Thus, the withstand voltage of the silicon carbide semiconductor device can be much improved.

The silicon carbide semiconductor device having the above constitution is manufactured in such a manner that a part of the P⁺ conductive type layer 8 disposed on the bottom of the trench 6 is partially covered with a mask in the process shown in FIG. 13D, which performs the RIE method to etch the P⁺ conductive type layer 8.

Fourth Embodiment

A fourth embodiment of the present invention is described. In this embodiment, the silicon carbide semiconductor device is manufactured by a different method different from the manufacturing method of the silicon carbide semiconductor device described in the first to third embodiments.

FIGS. 16A to 16G show manufacturing processes of the silicon carbide semiconductor device according to this embodiment. A manufacturing method of the silicon carbide semiconductor device according to this embodiment is explained with reference to the drawings.

Figure 16A:
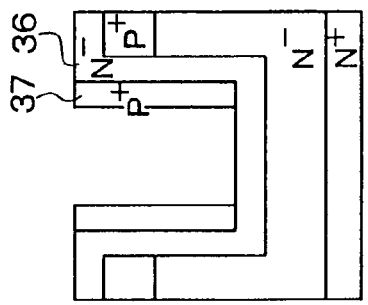
FIGS. 16A to 16G are cross sectional views showing a manufacturing method of a silicon carbide semiconductor device according to a fourth embodiment of the present invention.
Figure 16B:
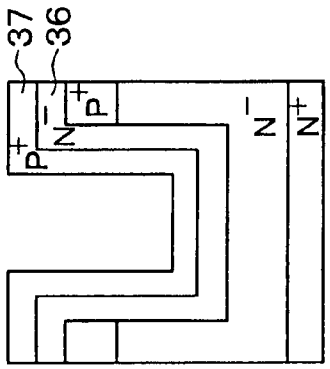

In a process shown in FIG. 16A, a semiconductor substrate 34 having an N⁺ conductive type substrate 31, an N⁻ conductive type drift layer 32 and a P⁺ conductive type layer 33 is prepared. The process in FIG. 16A is defined as a double epitaxial substrate forming step. Then, in a manufacturing process shown in FIG. 16B, a trench 35 is formed to penetrate the P⁺ conductive type layer 33 and to reach the N⁻ conductor type drift layer 32. The process in FIG. 16B is defined as a RIE etching step.

Figure 16C:
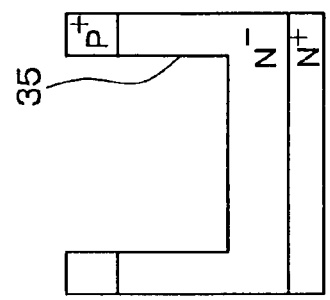
Figure 16D:
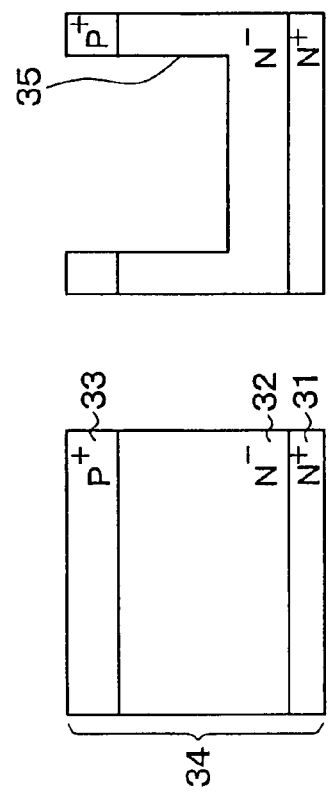

In a manufacturing process shown in FIG. 16C, an N⁻ conductive type epi-layer 36 and a P⁺ conductive type epi-layer 37 are formed on the whole surface of the semiconductor substrate 34 including the inner wall of the trench 35. The process in FIG. 16C is defined as an N conductive type epi-layer and a P conductive type epi-layer forming step. Then, a part of the P⁺ conductive type layer 37 disposed on the outside of the trench 35 and another portion of the P⁺ conductive type layer 37 disposed on the bottom of the trench 35 are removed by the RIE (i.e., reactive ion etching) method in a manufacturing process shown in FIG. 16D. The process in FIG. 16D is defined as a RIE etching step. The part and the other part of the P⁺ conductive type layer 37 are parallel to the principal surface of the semiconductor substrate 34. Thus, the P⁺ conductive type layer 37 only remains on the sidewall of the trench 6.

Figure 16E:
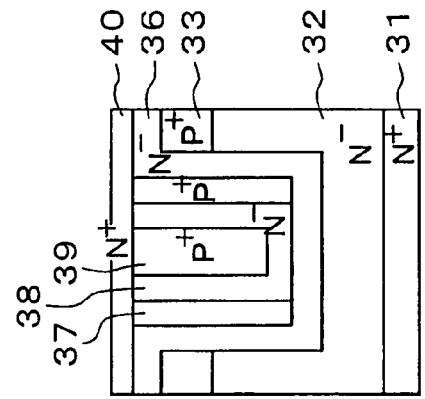

In a manufacturing process shown in FIG. 16E, an N⁻ conductive type epi-layer 38 is formed on the surface of the semiconductor substrate 34 including the inside of the trench 35. Specifically, the N⁻ conductive type epi-layer 38 is formed on the surfaces of the N⁻ conductive type layer 36 and the P⁺ conductive type layer 37. Then, a P⁺ conductive type layer 39 is formed on the surface of the N⁻ conductive type epi-layer 38 so that the inside of the trench 35 is completely embedded. The process in FIG. 16E is defined as an N conductive type epi-layer and a P conductive type epi-layer forming step.

Figure 16F:
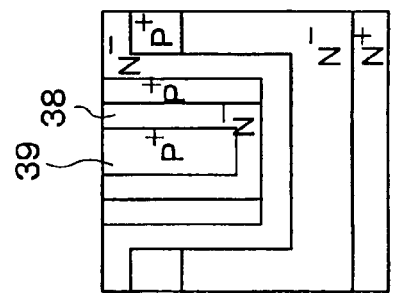

Next, in a manufacturing process shown in FIG. 16F, the surface of the N⁻ conductive type layer 36 is exposed by an etch-back method. The process in FIG. 16F is defined as an etch back step.

Figure 16G:
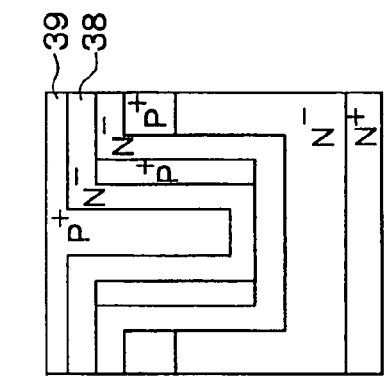
Figure 17:
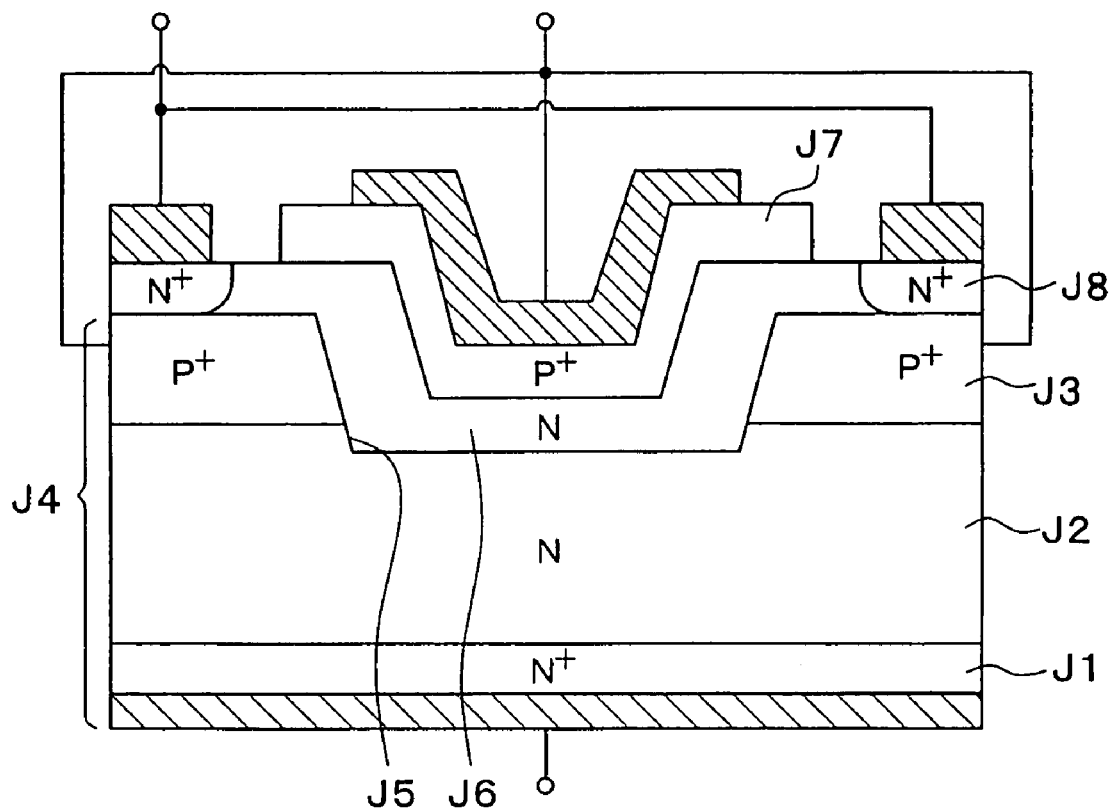
FIG. 17 is a cross sectional view showing a J-FET according to a prior art.

After that, in a manufacturing process shown in FIG. 16G, an N⁺ conductive type layer 40 is formed on the whole surface of the semiconductor substrate 34. The process in FIG. 16G is defined as an N conductive type source epi-layer forming step.

After that, a patterning process of the N+ conductive type layer 40 in addition to well known processes such as an interlayer insulation film forming process, a contact hole forming process, a wire forming process, and a protection film forming process are performed so that the silicon carbide semiconductor device according to this embodiment is completed.

The cross section of the silicon carbide semiconductor device manufactured by the above method is a slightly different from that of the first embodiment. Specifically, an electric connection between the P+ conductive type layers 33, 37, 39 and a gate wire (not shown) is provided by a contact hole formed in the N+ conductive type layer 40. Further, the N+ conductive type layer 40 works as the source layer. The constitution of the device is almost the same as that of the first to third embodiments except for the above two points.

Other Embodiments (1) In each embodiment, although the impurity concentration of each part composing the silicon carbide semiconductor device is described appropriately, these concentrations are merely samples. Therefore, these concentrations can be changed to different concentrations.

Although the impurity concentration of each N− conductive type epi-layer 7, 9 is higher than the N− conductive type drift layer 2 in the first embodiment, even when the impurity concentration of each N− conductive type epi-layer 7, 9 is equal to the N− conductive type drift layer 2, the on-state resistance can be reduced since each J-FET of the silicon carbide semiconductor device operates with a multi-channel operation.

Further, although the impurity concentration of the P+ conductive type layer 8 is lower than the impurity concentration of each P+ conductive type layer 3, 10 in the first embodiment, the impurity concentration of the P+ conductive type layer 8 can be almost equal to that of each P+ conductive type layer 3, 10. Further, impurity concentration of the P+ conductive type layer 8 can be higher than that of each P+ conductive type layer 3, 10. Further, their concentration relationship can be reversed.

(2) Although the device is operated with a double gate operation in each embodiment, the present invention can be applied to a silicon carbide semiconductor device having another control operation. The double gate operation is such that the electric potential of each of the first and second gate wires 12, 13 is capable of controlling independently.

For example, when only the electric potential of the first gate wire 12 can be controlled independently and the electric potential of the second gate wire 13 has the same electric potential as the source electrode 14, a single gate operation is performed. The single gate operation is such that the extension of the depletion layer extending from the P+ conductive type layers 8, 10 to the N− conductive type epi-layer 7, 9 is controlled on the basis of the electric potential of the first gate wire 12. In this case, the device basically performs the operation similar to the double gate operation. However, in the single gate operation, the channel region is defined only by the depletion layer extending from the P+ conductive type layers 8, 10.

(3) Although the trench 6, 35 is embedded with the P+ conductive type layer 10, 39 completely in each embodiment, the P+ conductive type layer 10, 39 can be formed in the trench 6, 35 partially so that the trench 6, 35 is not embedded with the P+ conductive type layer 10, 39 completely. In this case, for example, the trench 6 can be embedded with the interlayer insulation film 16 completely. Further, the trench 6 can be embedded with the gate wire 12 completely.

Furthermore, one or more pairs of equivalent films of the N− conductive type epi-layer 9 and the P+ conductive type layer 10 are repeatedly formed so that the number of the channel layers can be increased.

(4) Although the P+ conductive type layers 8, 10 are connected to the common gate wire 12 in each embodiment, the P+ conductive type layers 8, 10 can be connected to different gate wires, respectively. When the number of the P+ conductive type layer as the gate layer is increased, the increased P+ conductive type layers can be connected to different gate wires individually.

(5) In the silicon carbide semiconductor device according to each embodiment, the N conductive type corresponds to the first conductive type disclosed in the present invention, and the P conductive type corresponds to the second conductive type disclosed in the present invention. However, these are one example, so that the present invention can be applied to the silicon carbide semiconductor device having the reversed conductive types. This is, the N conductive type can correspond to the second conductive type, and the P conductive type can correspond to the first conductive type.

Such changes and modifications are to be understood as being within the scope of the present invention as defined by the appended claims.

What is claimed is:

1. A method for manufacturing a silicon carbide semiconductor device, the method comprising the steps of:
   preparing a substrate having a first conductive type and made of silicon carbide;
   forming a first semiconductor layer on the substrate, wherein the first semiconductor layer has the first conductive type and is made of silicon carbide with a low impurity concentration lower than the substrate;
   forming a first gate layer on a surface of the first semiconductor layer, wherein the first gate layer has a second conductive type and is made of silicon carbide;
   forming a first channel layer on the substrate to be adjacent to the first gate layer in a planar direction, wherein the first channel layer has the first conductive type;
   forming a first source layer to connect to the first channel layer electrically, wherein the first source layer has the first conductive type and has a high impurity concentration higher than the first channel layer;
   forming a second gate layer to be adjacent to the first channel layer, wherein the second gate layer has the second conductive type and is disposed opposite to the first gate layer to sandwich the first channel layer;
   forming a second channel layer to be adjacent to the second gate layer, wherein the second channel layer has the first conductive type and is disposed opposite to the first channel layer to sandwich the second gate layer;
   forming a third gate layer to be adjacent to the second channel layer, wherein the third gate layer is disposed opposite to the second gate layer to sandwich the second channel layer; and
   forming a second source layer to connect to the second channel layer electrically, wherein the second source layer has the first conductive type and has a high impurity concentration higher than the second channel layer,
   wherein an impurity concentration of the first channel layer is equal to an impurity concentration of the second channel layer, and
   wherein the impurity concentration of the first channel layer is higher than an impurity concentration of the first semiconductor layer, and lower than an impurity concentration of the second gate layer.

2. The method for manufacturing the silicon carbide semiconductor device according to claim 1,
wherein the first channel layer is formed by an epitaxial growth method in the step of forming the first channel layer.

3. The method for manufacturing the silicon carbide semiconductor device according to claim 1,
wherein the first gate layer is formed by an epitaxial growth method in the step of forming the first gate layer.

4. The method for manufacturing the silicon carbide semiconductor device according to claim 1,
wherein the second channel layer is formed by an epitaxial growth method in the step of forming the second channel layer.

5. The method for manufacturing the silicon carbide semiconductor device according to claim 1,
wherein the second gate layer is formed by an epitaxial growth method in the step of forming the second gate layer.

6. The method for manufacturing the silicon carbide semiconductor device according to claim 1,
wherein the silicon carbide semiconductor device is a RESURF type semiconductor device, and
wherein the first and second channel layers are separated from the first semiconductor layer.

7. A method for manufacturing a silicon carbide semiconductor device, the method comprising the steps of:
preparing a semiconductor substrate, which includes:
a substrate made of silicon carbide and having a first conductive type;
a first semiconductor layer disposed on the substrate, having the first conductive type, and made of silicon carbide with a low impurity concentration lower than the substrate;
a second semiconductor layer having a second conductive type, made of silicon carbide, and providing a first gate layer; and
a third semiconductor layer having the first conductive type, made of silicon carbide, and providing a first source layer;
forming a trench on a surface of the semiconductor substrate to penetrate the second and third semiconductor layers and to reach the first semiconductor layer;
forming a first channel layer having the first conductive type on an inner wall of the trench;
forming a second gate layer having the second conductive type on a sidewall of the trench through the first channel layer;
forming a second channel layer having the first conductive type on the sidewall of the trench through the first channel layer and the second gate layer and on a bottom of the trench through the first channel layer;
forming a third gate layer having the second conductive type on the inner wall of the trench through the second channel layer; and
forming a second source layer on a part of the surface of the semiconductor substrate corresponding to the second channel layer so that the second source layer connects to the second channel layer electrically, wherein the second source layer has the first conductive type and has a high impurity concentration higher than the second channel layer.

8. The method for manufacturing the silicon carbide semiconductor device according to claim 7,
wherein the first channel layer is formed by an epitaxial growth method in the step of forming the first channel layer.

9. The method for manufacturing the silicon carbide semiconductor device according to claim 7,
wherein the first gate layer is formed by an epitaxial growth method in the step of forming the first gate layer.

10. The method for manufacturing the silicon carbide semiconductor device according to claim 7,
wherein the second channel layer is formed by an epitaxial growth method in the step of forming the second channel layer.

11. The method for manufacturing the silicon carbide semiconductor device according to claim 7,
wherein the second gate layer is formed by an epitaxial growth method in the step of forming the second gate layer.

12. A method for manufacturing a silicon carbide semiconductor device, the method comprising the steps of:
preparing a semiconductor substrate, which includes:
a substrate made of silicon carbide and having a first conductive type;
a first semiconductor layer disposed on the substrate, having the first conductive type, and made of silicon carbide with a low impurity concentration lower than the substrate; and
a second semiconductor layer having a second conductive type, made of silicon carbide, and providing a first gate layer;
forming a trench on a surface of the semiconductor substrate to penetrate the second semiconductor layer and to reach the first semiconductor layer;
forming a first channel layer having the first conductive type on an inner wall of the trench and on the second semiconductor layer;
forming a second gate layer having the second conductive type on a sidewall of the trench through the first channel layer;
forming a second channel layer having the first conductive type on the sidewall of the trench through the first channel layer and the second gate layer and on a bottom of the trench through the first channel layer;
forming a third gate layer having the second conductive type on an inner wall of the trench through the second channel layer; and
forming a source layer on a part of the surface of the semiconductor substrate corresponding to the second channel layer so that the source layer connects to the second channel layer electrically, and on another part of the surface of the semiconductor substrate corresponding to the first channel layer so that the source layer connects to the first channel layer electrically, wherein the source layer has the first conductive type and has a high impurity concentration higher than the second channel layer.

13. The method for manufacturing the silicon carbide semiconductor device according to claim 12,
wherein the first channel layer is formed by an epitaxial growth method in the step of forming the first channel layer.

14. The method for manufacturing the silicon carbide semiconductor device according to claim 12,
wherein the first gate layer is formed by an epitaxial growth method in the step of forming the first gate layer.

15. The method for manufacturing the silicon carbide semiconductor device according to claim 12, wherein the second channel layer is formed by an epitaxial growth method in the step of forming the second channel layer.

16. The method for manufacturing the silicon carbide semiconductor device according to claim 12,
wherein the second gate layer is formed by an epitaxial growth method in the step of forming the second gate layer.

* * * * *